(12) United States Patent
Schenk

(10) Patent No.: US 12,190,932 B2
(45) Date of Patent: Jan. 7, 2025

(54) MEMORY DEVICE, MEMORY CONTROLLER, AND METHODS THEREOF

(71) Applicant: Ferroelectric Memory GmbH, Dresden (DE)

(72) Inventor: Tony Schenk, Dresden (DE)

(73) Assignee: Ferroelectric Memory GmbH, Dresden (DE)

( * ) Notice: Subject to any disclaimer, the term of this patent is extended or adjusted under 35 U.S.C. 154(b) by 208 days.

(21) Appl. No.: 17/806,673

(22) Filed: Jun. 13, 2022

(65) Prior Publication Data

US 2023/0402083 A1    Dec. 14, 2023

(51) Int. Cl.
*G11C 11/22* (2006.01)

(52) U.S. Cl.
CPC ........ *G11C 11/2273* (2013.01); *G11C 11/221* (2013.01); *G11C 11/2259* (2013.01)

(58) Field of Classification Search
CPC .............. G11C 11/2273; G11C 11/221; G11C 11/2259
USPC ........................................................ 365/145
See application file for complete search history.

(56) References Cited

U.S. PATENT DOCUMENTS

| | | | |
|---|---|---|---|
| 10,438,645 B2 | 10/2019 | Müller et al. | |
| 10,460,788 B2 | 10/2019 | Müller | |
| 10,622,051 B2 | 4/2020 | Müller et al. | |
| 10,650,892 B2 | 5/2020 | Noack | |
| 10,978,129 B1 | 4/2021 | Müller | |
| 11,049,541 B2 | 6/2021 | Müller | |
| 11,081,159 B1 | 8/2021 | Jähne et al. | |
| 11,101,291 B2 | 8/2021 | Mennenga et al. | |
| 11,158,361 B2 | 10/2021 | Müller | |
| 11,189,331 B1 | 11/2021 | Benoist et al. | |
| 11,195,589 B1 | 12/2021 | Ocker et al. | |
| 11,289,145 B2 | 3/2022 | Ocker et al. | |
| 11,309,034 B2 | 4/2022 | Mennenga et al. | |
| 11,309,792 B2 | 4/2022 | Iqbal et al. | |
| 11,309,793 B2 | 4/2022 | Iqbal et al. | |
| 11,393,518 B1 | 7/2022 | Ocker | |

(Continued)

OTHER PUBLICATIONS

Li et al., "Switching dynamics of ferroelectric HfO2—ZrO2 with various ZrO2 contents" Cite as: Appl. Phys. Lett. 114, 142902 (2019); doi: 10.1063/1.5093793, Submitted: Feb. 25, 2019 . Accepted: Mar. 24, 2019, Published Online: Apr. 10, 2019, 6 pages.

(Continued)

*Primary Examiner* — Huan Hoang
(74) *Attorney, Agent, or Firm* — Husch Blackwell LLP

(57) ABSTRACT

Various aspects relate to a destructive read out operation to read out a memory state of a remanent polarizable capacitive memory element. The destructive read out operation may include causing a voltage drop sequence over the remanent polarizable capacitive memory element, wherein the voltage drop sequence includes one or more voltage drops of a first polarity and one or more voltage drops of a second polarity opposite the first polarity. In some aspects, the destructive read out operation is configured as a bipolar read out operation to determine the memory state of the remanent polarizable capacitive memory element based on an electrical behavior of the remanent polarizable capacitive memory element during the voltage drop sequence.

20 Claims, 21 Drawing Sheets

(56) References Cited

U.S. PATENT DOCUMENTS

| | | |
|---|---|---|
| 11,443,792 B1 | 9/2022 | Iqbal et al. |
| 11,475,935 B1 | 10/2022 | Ocker |
| 11,508,426 B1 | 11/2022 | Ocker |
| 2006/0002171 A1* | 1/2006 | Gudesen ............ G11C 11/22 365/145 |
| 2019/0130956 A1 | 5/2019 | Müller et al. |
| 2019/0130957 A1 | 5/2019 | Müller |
| 2019/0325963 A1 | 10/2019 | Noack |
| 2020/0027493 A1 | 1/2020 | Müller et al. |
| 2020/0357455 A1 | 11/2020 | Noack et al. |
| 2020/0357470 A1 | 11/2020 | Noack |
| 2021/0005238 A1 | 1/2021 | Müller |
| 2021/0082958 A1 | 3/2021 | Mennenga et al. |
| 2021/0090662 A1 | 3/2021 | Mennenga et al. |
| 2021/0091097 A1 | 3/2021 | Mennenga |
| 2021/0125656 A1 | 4/2021 | Müller |
| 2021/0217454 A1 | 7/2021 | Ocker |
| 2021/0312969 A1 | 10/2021 | Noack et al. |
| 2021/0327901 A1 | 10/2021 | Noack |
| 2021/0336534 A1 | 10/2021 | Iqbal et al. |
| 2022/0020776 A1 | 1/2022 | Mennenga et al. |
| 2022/0060105 A1 | 2/2022 | Iqbal |
| 2022/0122995 A1 | 4/2022 | Ocker et al. |
| 2022/0122996 A1 | 4/2022 | Ocker et al. |
| 2022/0122999 A1 | 4/2022 | Polakowski |
| 2022/0139437 A1 | 5/2022 | Ocker |
| 2022/0139931 A1 | 5/2022 | Ocker |
| 2022/0139932 A1 | 5/2022 | Polakowski |
| 2022/0139933 A1 | 5/2022 | Noack |
| 2022/0139934 A1 | 5/2022 | Müller |
| 2022/0139936 A1 | 5/2022 | Ocker |
| 2022/0139937 A1 | 5/2022 | Müller et al. |
| 2022/0172791 A1 | 6/2022 | Schenk |
| 2022/0173114 A1 | 6/2022 | Schenk |
| 2022/0189524 A1 | 6/2022 | Ocker |
| 2022/0199166 A1 | 6/2022 | Mennenga et al. |
| 2022/0270659 A1 | 8/2022 | Ocker |
| 2022/0277794 A1 | 9/2022 | Noack |
| 2022/0374202 A1 | 11/2022 | Villa et al. |
| 2022/0376114 A1 | 11/2022 | Müller |
| 2023/0041759 A1 | 2/2023 | Noack et al. |
| 2023/0046259 A1 | 2/2023 | Iqbal |
| 2023/0135718 A1 | 5/2023 | Minh et al. |
| 2023/0170029 A1 | 6/2023 | Sivero |
| 2023/0189531 A1 | 6/2023 | Muller |
| 2023/0189532 A1 | 6/2023 | Muller |
| 2023/0223066 A1 | 7/2023 | Muller |
| 2023/0247842 A1 | 8/2023 | Muller |
| 2023/0284454 A1 | 9/2023 | Ocker et al. |
| 2023/0335174 A1 | 10/2023 | Kuzmanov |
| 2023/0360684 A1 | 11/2023 | Sivero |
| 2023/0371268 A1 | 11/2023 | Muller |

OTHER PUBLICATIONS

Schenk et al., "Memory Technology—A Primer for Material Scientists" Reports on Progress in Physics, 98 pages.

Schenk et al., "A New Generation of Memory Devices Enabled by Ferroelectric Hafnia and Zirconia", 11 pages.

Scott, J.F., "Ferroelectric Memories", Advanced Microelectronics.

\* cited by examiner

MEMORY DEVICE, MEMORY CONTROLLER, AND METHODS THEREOF

TECHNICAL FIELD

Various aspects relate to an electronic device or at least a part of an electronic device, e.g., to a memory device, a memory controller, a memory arrangement, and methods thereof, e.g., a method for reading a memory cell of a memory device, e.g., a method for operating a memory controller.

BACKGROUND

In general, various computer memory technologies have been developed in the semiconductor industry. A fundamental building block of a computer memory may be referred to as a memory cell. The memory cell may be an electronic circuit that is configured to store at least one piece of information (e.g., bitwise). As an example, the memory cell may be selectively in one of at least two memory states representing, for example, a logic "1" and a logic "0". In general, the information may be maintained (stored) in a memory cell until the memory state of the memory cell is modified, e.g., in a controlled manner. The information stored in the memory cell may be obtained (read out) by determining in which of the memory states the memory cell is residing in. At present, various types of memory cells may be used to store data. By way of example, a type of memory cell may include a thin film of a spontaneously polarizable material, e.g., a ferroelectric material or a configuration of an anti-ferroelectric material, whose polarization state may be changed in a controlled fashion to store data in the memory cell, e.g. in a non-volatile manner.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the invention are described with reference to the following drawings, in which.

DESCRIPTION

Figure 1A:
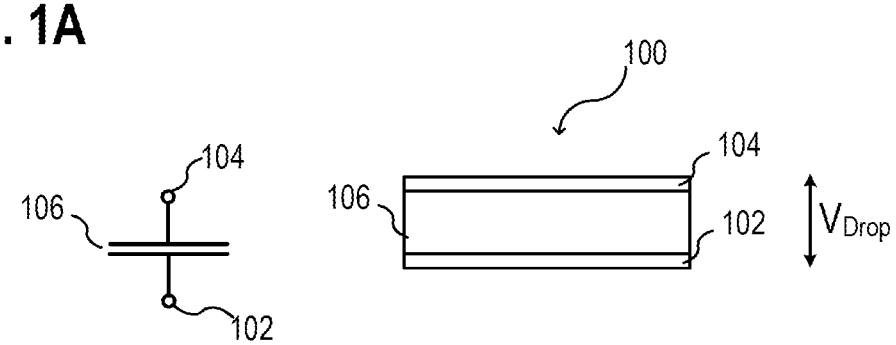
FIG. 1A shows various aspects of a memory element in a schematic view.

The following detailed description refers to the accompanying drawings that show, by way of illustration, specific details and aspects in which the invention may be practiced. These aspects are described in sufficient detail to enable those skilled in the art to practice the invention. Other aspects may be utilized and structural, logical, and electrical changes may be made without departing from the scope of the invention. The various aspects are not necessarily mutually exclusive, as some aspects may be combined with one or more other aspects to form new aspects. Various aspects are described in connection with methods and various aspects are described in connection with devices (e.g., a memory device, or a memory element, or a memory controller). However, it may be understood that aspects described in connection with methods may similarly apply to the devices, and vice versa.

Various aspects relate to a read operation to read a memory cell efficiently, e.g., to allow for a read out of a memory cell in the case that a memory element of the memory cell shows an imprint effect or another comparable effect that may cause a modification of a memory window of the memory cell, as explained in more detail below. The memory cell may be a capacitive memory cell including a capacitive memory element.

A memory element (e.g., a capacitive memory element) of a memory cell may include, for example, at least one remanent polarizable portion in a capacitive arrangement (e.g., the at least one remanent polarizable portion may be disposed between two corresponding electrodes). Such a memory element may be referred to as a remanent polarizable capacitive memory element and a memory cell including such a memory element (e.g., consisting of such a memory element) may be referred to as a remanent polarizable capacitive memory cell.

As an example, a remanent polarizable portion of a memory element may include (e.g., may consist of) at least one spontaneously polarizable memory material. In other words, a memory material of a memory cell (e.g., of a capacitive memory cell, e.g., of a remanent polarizable capacitive memory cell) may be a spontaneously polarizable material. The spontaneously polarizable material may be a remanent or non-remanent spontaneously polarizable material such as a ferroelectric material (that itself shows a residual polarization and, therefore, has a remanent effect related to the polarization properties) or an anti-ferroelectric material (that itself does not show a residual polarization and, therefore, has no remanent effect related to the polarization properties). However, an anti-ferroelectric material may be brought into a condition, e.g., into a charged or otherwise modified condition, that a remanent storage of data may be possible even though the memory material itself shows no remanent polarization effect. There may be other memory element designs that may show remanent polarization properties based on non-intrinsic effects, e.g., a remanent polarizable portion may be provided by a meta-material or a structure that shows charge-carrier tunneling properties that may lead to similar effects as obtained by intrinsically remanent polarizable materials.

According to various aspects, a memory cell as described herein may include a memory element, e.g., a capacitive memory element, e.g., a remanent polarizable capacitive memory element. In some aspects, a memory element may be coupled to an access device, to an access field-effect transistor structure, and the resulting memory cell may be addressed by respective sets of control lines, see, for example, a 1T1C memory cell as described herein. In such an arrangement, the memory cell may include three terminals (also referred to as nodes), e.g., a word-line terminal, a bit-line terminal, and a plate-line terminal. In other aspects, a memory element (e.g., a capacitive memory element, e.g., a remanent polarizable capacitive memory element) may be addressed directly by two sets of control lines, by a set of word-lines and a set of bit-lines, see, for example, a 1C memory cell as described herein. In such an arrangement, the memory cell may include two terminals (also referred to as nodes), e.g., a word-line terminal and a bit-line terminal.

According to various aspects, a remanent polarizable portion may show a hysteresis in the (voltage dependent) polarization. The remanent polarizable portion may show ferroelectric properties, e.g., the spontaneously polarizable layer may have a remanent polarization or a substantial remanent polarization remaining in the case that no voltage drops over the spontaneously polarizable layer.

According to various aspects, in various types of applications, e.g., in memory technology, a remanent polarization as low as 0 µC/cm² to 3 µC/cm² may be regarded as no substantial remanent polarization. Such low values of a remanent polarization may be present in a layer or material due to undesired effects, e.g., due to a not ideal layer formation. According to various aspects, in various types of applications, e.g., in memory technology, a remanent polarization greater than 3 µC/cm² may be regarded as substantial remanent polarization. Such a substantial remanent polarization may allow for storing information as a function of a polarization state of a spontaneously polarizable layer or a spontaneously polarizable material.

A polarization capability of a material (dielectric, spontaneous, and remanent polarization) may be analyzed using capacity measurements (e.g., a spectroscopy), e.g., via a static (C-V) and/or time-resolved measurement or by polarization-voltage (P-V) or positive-up-negative-down (PUND) measurements. Another method for determining a polarization capability of a material may include transmission electron microscopy, e.g., an electric-field dependent transmission electron microscopy.

According to various aspects, a memory device may include a memory cell and a memory controller to operate (e.g., to read and/or to write) the memory cell. It is noted that some aspects are described herein with reference to a memory cell of a memory device; it is understood that a memory device may include a plurality of such described memory cells according to various aspects that can be operated in the same way by the memory controller, e.g., at the same time or in a time sequence. The memory device may further include respective sets of control lines and voltage supply levels configured to operate the one or more memory cells of the memory device.

FIG. 1A shows various aspects of a memory element 100. The memory element 100 may be a capacitive memory element, wherein a functional portion 106 of the memory element 100 is disposed between a first electrode 102 of the memory element 100 and a second electrode 104 of the memory element 100. The functional portion 106 may include at least one spontaneously (e.g., remanent) polarizable portion such that the memory element 100 is a remanent polarizable capacitive memory element. In some aspects, as described herein, the memory element 100 may include at least one remanent polarizable portion and therefore, a memory cell including the memory element 100 may include at least one remanent polarizable portion such that the memory cell is a remanent polarizable capacitive memory cell.

The memory element 100 is illustrated in a planar configuration, only as an example. The memory element 100 may also have a curved and/or angled shape, e.g., the memory element 100 may be configured as a trench capacitor or may have any other suitable capacitive design. FIG. 1A shows further an equivalent circuit 100e of the memory element 100 to show its capacitive properties. The functional portion 106 of the memory element 100 is substantially non-conductive, or provides at least no conductive connection between the two electrodes 102, 104 of the memory element 100.

Figure 1B:
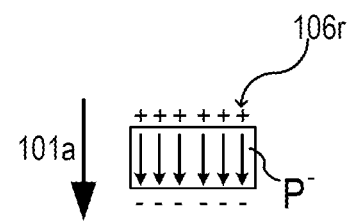
FIG. 1B and FIG. 1C schematically show various aspects of a polarization within a remanent polarizable portion.
Figure 1C:
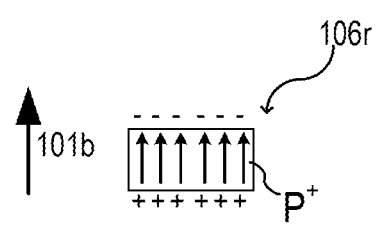

FIG. 1B and FIG. 1C show schematically a remanent polarizable portion 106r that may be included in a memory element 100 or memory cell, according to various aspects. Two exemplary polarization states of the remanent polarizable portion 106r are illustrated that may be associated with two memory states of a memory element 100 respectively. The respective polarization state of the memory element 100 may be defined by a residual polarization $P^+$, $P^-$ of the remanent polarizable portion 106r, as explained in more detail below.

Only as an example, in a first polarization state, the residual polarization, $P^-$, within the remanent polarizable portion 106r may be directed in a first direction 101a (see FIG. 1B). In a second polarization state, the residual polarization $P^+$ within the remanent polarizable portion 106r may be directed in a second direction 101b (see FIG. 1C). The first polarization state may be referred herein to as negative polarization state, negative state, negative memory state, or short as $P^-$-state. The second polarization state may be referred herein to as positive polarization state, positive state, positive memory state, or short as $P^+$-state. The second direction 101b may be opposite or at least angled with respect to the first direction 101a.

According to various aspects, the positive polarization state may be associated with a first (e.g. positive) coercive field, $E_C^+$, which may be or represent the field required to depolarize the remanent-polarizable portion 106r. According to various aspects, the negative polarization state may be associated with a second (e.g. negative) coercive field, $E_C^-$, which may be or represent the field required to depolarize the remanent-polarizable portion 106r.

According to various aspects, the residual polarization $P^+$, $P^-$, may cause an aggregation of positive charges (holes, represented by the symbol "+") and negative charges (electrons, represented by the symbol "−") in the surrounding of the remanent-polarizable portion 106r, for example in an electrode. A change of a polarization of the remanent polarizable portion 106r from a positive polarization state to a negative polarization state and vice versa may be associated with a switching current due to the change of the aggregation of the charges in the surrounding of the remanent-polarizable portion 106r. Therefore, a memory state of a memory element 100 including the remanent polarizable portion 106r may be determined as a function of a voltage drop $V_{Drop}$ (see FIG. 1A) over the remanent polarizable portion 106r and a corresponding response of the remanent polarizable portion 106r.

As an example, in the case that the voltage drop $V_{Drop}$ has a positive polarity (e.g., a more positive electric potential may be present at the second electrode 104 than at the first electrode 102), the remanent polarizable portion 106r of the memory element 100 may switch from a negative polarization state to a positive polarization state and may cause a switching current (e.g., a switching current and a dielectric current) in the case that the remanent polarizable portion 106r is in the negative polarization state prior to the application of the voltage drop $V_{Drop}$ that has a positive polarity and may cause no switching current (e.g., only a dielectric current) in the case that the remanent polarizable portion 106r is in a positive polarization state prior to the application of the voltage drop $V_{Drop}$ that has a positive polarity. In a similar way, as another example, in the case that the voltage drop $V_{Drop}$ has a negative polarity (e.g., a more negative electric potential may be present at the second electrode 104 than at the first electrode 102), the remanent polarizable portion 106r of the memory element 100 may switch from a positive polarization state to a negative polarization state and may cause a switching current (e.g., a switching current and a dielectric current) in the case that the remanent polarizable portion 106r is in the positive polarization state prior to the application of the voltage drop $V_{Drop}$ that has a negative polarity and may cause no switching current (e.g., only a dielectric current) in the case that the remanent polarizable portion 106r is in a negative polarization state prior to the application of the voltage drop $V_{Drop}$ that has a negative polarity.

Therefore, the presence and/or absence of the switching current upon an application of a voltage drop with a predefined polarity may allow for a determination of whether the remanent polarizable portion 106r was in a positive polarization state or a negative polarization state prior to the application of the voltage drop $V_{Drop}$. Since the polarization states of the remanent polarizable portion 106r may be related to (e.g., may define the) memory states of the memory element 100 and therefore the memory states of a memory cell that includes the memory element 100, the memory state may be read out by determining a presence and/or an absence of one or more switching currents upon an application of one or more voltage drops with a predefined polarities, as described herein. Since the polarization state of the remanent polarizable portion 106r and therefore the memory state of the memory element 100 or the memory cell may be changed during the read out (due to the voltage drop that may switch the polarization state), the read out described herein may be a so called destructive read out. After a destructive read out, the memory cell that was read may be always in a same memory state independently of an initial memory state in which the memory cell was prior to the read out.

According to various aspects, a capacitor memory element 100 that includes a remanent-polarizable portion 106r may be referred to as ferroelectric capacitor "FeCAP", in the case that the remanent-polarizable portion 106r is a ferroelectric portion. A ferroelectric capacitor may be used as a memory cell or may be part of a memory cell, as described herein, see, for example, FIG. 2A and FIG. 2B.

Figure 2A:
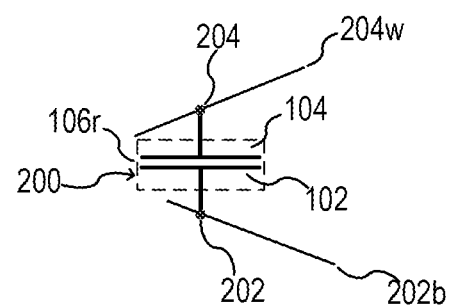
FIG. 2A and FIG. 2B schematically show various aspects of a memory device, e.g., of a memory cell including a memory element with a remanent polarizable portion.
Figure 2B:
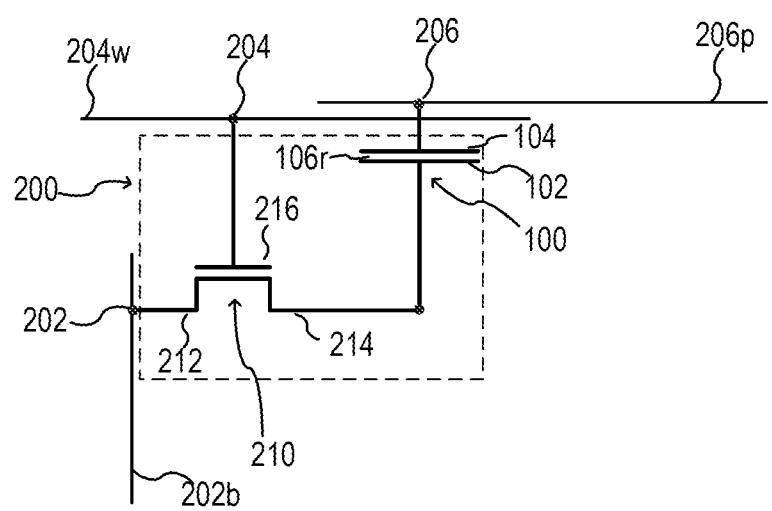

FIG. 2A and FIG. 2B schematically show various aspects of a memory cell 200 including a memory element 100 with a remanent polarizable portion 106r in a capacitive arrangement, e.g., disposed between a first electrode 102 and a second electrode 104 of the memory element 100. In some aspects, the memory element 100 may be used as a memory cell 200. As an example, the memory cell 200 may be a ferroelectric capacitor, according to various aspects, as schematically illustrated in FIG. 2A. In this case, the memory cell 200 may have a first terminal 202 connected to or provided by the first electrode 102 of the memory element 100 and a second terminal connected to or provided by the second electrode 104 of the memory element 100. Such a two terminal memory cell 200 may be addressed by a word-line 204w connected to the second terminal 204 (therefore to the word-line terminal 204) and a bit-line 202b connected to the first terminal 202 (therefore to the bit-line terminal 202). In the same way, a set of two-terminal memory cells 200 may be addressed by a set of word-lines and a set of bit-lines, e.g., in a crossbar arrangement or in any other arrangement suitable to address the memory cells 200. A sense amplifier or any other measurement device may be coupled with the one or more bit-lines of one or more memory cells 200 to determine, for example, an electrical behavior of the one or more memory cells 200 during a read out operation. According to various aspects, a respective bit-line 202b may have a capacitance associated therewith that allows for a charging of the bit-line as a function of one or more switching currents during read out of a corresponding memory cell, such that a read out voltage to which the bit-line is charged may be representative for an intimal memory state of the memory cell prior to the read out.

As another example, the memory cell 200 may include a memory element 100 (e.g., a ferroelectric capacitor) coupled to an access device, according to various aspects, as schematically illustrated in FIG. 2B. The access device is exemplary illustrated as an access field-effect transistor 210; however, any other suitable access device may be used in a similar way.

In this case, the memory cell 200 may have a first terminal 202 and a second terminal 204 to control the access device, e.g., the access field-effect transistor 210. The access field-effect transistor 210 may have a source 212, a drain 214, and a gate 216, wherein the first terminal 202 of the memory cell 200 may be connected to or provided by the source 212 of the access field-effect transistor 210, wherein the second terminal 204 of the memory cell 200 may be connected to or provided by the gate 216 of the access field-effect transistor 210, and wherein the first electrode 102 of the memory element 100 is connected to the drain 214 of the access field-effect transistor 210. The memory cell 200 may have a third terminal connected to or provided by the second electrode 104 of the memory element 100. Such a three terminal memory cell 200 may be addressed by a word-line 204w connected to the second terminal 204 (therefore to the word-line terminal 204), a bit-line 202b connected to the first terminal 202 (therefore to the bit-line terminal 202), and a plate-line 206p connected to the third terminal 206 (therefore to the plate-line terminal 206). In the same way, a set of three-terminal memory cells 200 may be addressed by a set of word-lines, a set of bit-lines, and a set of plate-lines. A sense amplifier or any other measurement device may be coupled with the one or more bit-lines of one or more memory cells 200 to determine, for example, an electrical behavior of the one or more memory cells 200 during a read out operation. According to various aspects, a respective bit-line 202b may have a capacitance associated therewith that allows for a charging of the bit-line as a function of one or more switching currents during read out of a corresponding memory cell, such that a read out voltage to which the bit-line is charged may be representative for an intimal memory state of the memory cell prior to the read out.

In the following, the possible effects occurring in a memory cell or in a memory element having a remanent polarizable portion during a storage period are described in the following, as an exemplary case. It is understood, that the same or similar considerations may apply also to other types of memory cells, in which predefined properties (e.g. a charge, a state of a material, etc.) may change during a retention period, and may be restored or at least influenced by a bipolar read operating as described herein.

According to various aspects, writing a memory cell or performing a write operation of a memory cell may include an operation or a process that modifies the memory state the memory cell is residing in from a (e.g. first) memory state to another (e.g. second) memory state. According to various aspects, writing a memory cell may include programming a memory cell (e.g., performing a programming operation of a memory cell), wherein the memory state the memory cell is residing in after programming may be called "programmed state". According to various aspects, writing a memory cell may include erasing a memory cell (e.g., performing an erasing operation of a memory cell), wherein the memory state the memory cell is residing in after the erasing may be called "erased state". As an example, the programmed state may be a positive polarization state (e.g. associated with a logic "1") and the erased state may be an electrically negative polarization state (e.g., associated with a logic "0"). However, the definition of programmed state and erased state may be selected arbitrarily.

The term "switch" may be used herein to describe a modification of the memory state a memory cell is residing in. For example, in the case that a memory cell is residing in a first memory state (e.g., the positive polarization state), the memory state the memory cell is residing in may be switched such that, after the switch, the memory cell may reside in a second memory state (e.g., the negative polarization state), different from the first memory state. The term "switch" may thus be used herein to describe a modification of the memory state a memory cell is residing in, from a first memory state to a second memory state. The term "switch" may also be used herein to describe a modification of a polarization, for example of a remanent-polarizable portion. For example, a polarization of a remanent-polarizable portion may be switched, such that the sign of the polarization varies from positive to negative or from negative to positive.

The term "shift" may be used herein to describe a change of a property of a memory cell or of a remanent-polarizable portion, such as a threshold voltage, a memory window, a coercive field, a polarization, a residual polarization, and the like. For example, a coercive field of a remanent-polarizable portion may be shifted, such that after the shift a value of the coercive field may be higher or lower than the value of the coercive field before the shift.

The term "actual" may be used herein in relation to a condition or to one or more properties (e.g., of a memory cell) to include, for example, an instantaneous condition and/or an instantaneous property (e.g., an instantaneous value of a property). As an example, the term "actual" may be used to describe a condition and/or a property at a particular time point. An actual property and/or an actual value of a property may be different from a predefined property and/or from a predefined value of a property or it may be equal to the predefined property and/or to a predefined value of the property. Illustratively, this may be similar to an actual value and a reference value (e.g., set-point value) of a controlled variable in a system (e.g., in a feedback loop), wherein the actual value may be the value of the controlled variable at a given time point and the reference value may be a set (predefined) value the variable is supposed to have.

FIG. 3A, FIG. 3B, FIG. 3C, and FIG. 3D as well as FIG. 4A, FIG. 4B, FIG. 4C, and FIG. 4D respectively show a diagram illustrating polarization characteristics of a remanent-polarizable portion, e.g., a remanent polarizable portion 106r of a memory cell 200, according to various aspects. In each diagram, a graph is plotted that illustrates a polarization, P, of the remanent polarizable portion 106r as a function of an electric field, E, applied via at least two electrodes (e.g., a first electrode 102 and a second electrode 104 of a memory element 100 or a memory cell 200) adjacent to the remanent polarizable portion 106r.

As shown in the figures, a remanent-polarizable portion may exhibit a hysteretic behavior illustrated in form of hysteresis loops 300pe-1, 300pe-2, 300pe-3, 300pe-4, 400pe-1, 400pe-2, 400pe-3, 400pe-4. For increasing (positive or negative) applied electric fields, E, the corresponding polarization, P, of the remanent-polarizable portion may increase accordingly (illustratively, it may become more positive or more negative). When the field, E, is no longer applied (e.g. E=0), the polarization, P, does not vanish, but a residual polarization remains in the remanent-polarizable portion, for example, a first (e.g., positive) residual polarization, $P^+$, or a second (e.g., negative) residual polarization, $P^-$. The sign of the residual polarization may depend on whether the applied field, E, exceeds a respective threshold value (e.g., a positive coercive field, $E_C^+$, or a negative coercive field, $E_C^-$).

Figure 3A:
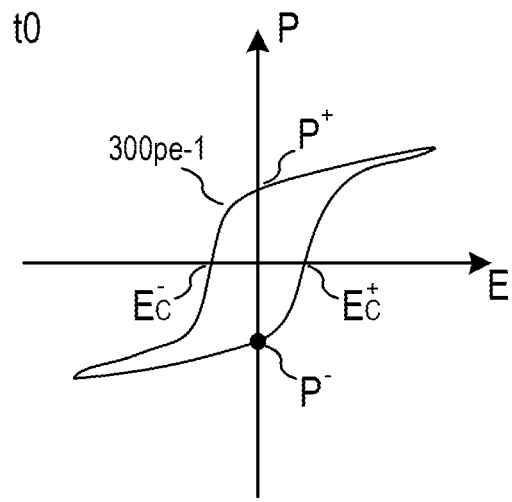
FIG. 3A to FIG. 3D, FIG. 4A to FIG. 4D, and FIG. 5A to FIG. 5C show various aspects of electrical polarization and imprint characteristics of a memory element with a remanent polarizable portion in a schematic view.

According to various aspects, FIG. 3A illustrates an exemplary predefined condition of a remanent-polarizable portion (e.g., a predefined condition of a memory cell including a remanent-polarizable portion). As an example, a first predefined condition of the remanent-polarizable portion may be a first predefined polarization state (e.g., a condition in which the remanent-polarizable portion has a first predefined residual polarization, e.g., $P^+$). As another example, a second predefined condition may be a second predefined polarization state (e.g., a condition in which the remanent-polarizable portion has a second predefined residual polarization, e.g., $P^-$). According to various aspects, an absolute value of a positive coercive field, $E_C^+$, and/or a positive residual polarization, $P^+$, of the remanent-polarizable portion associated with the first predefined polarization state may be substantially equal to an absolute value of a negative coercive field, $E_C^-$, and/or a negative residual polarization, $P^-$, of the remanent-polarizable portion associated with the second predefined polarization state. As an explanation, in a predefined condition of the remanent-polarizable portion, the two polarization states (in some aspects, the two memory states) associated with the positive and the negative residual polarizations may both be equally stable, and there may be no polarization state favored over the other. The hysteresis curve may thus be centered in the diagram with respect to the origin of both E and P.

The behavior over time of the remanent-polarizable portion will now be described in more detail assuming, as an exemplary case, that the remanent-polarizable portion is residing, at a time t0, in the negative polarization state. It is thus assumed that the remanent-polarizable portion has negative residual polarization, $P^-$, in absence of an applied electric field, E, as illustratively represented by the black dot in FIG. 3A. An opposite scenario in which the remanent-polarizable portion is residing, at a time t0, in the positive polarization state will be described in further detail below, for example in relation to FIG. 4A to FIG. 4D illustrating hysteresis loops 400pe-1, 400pe-2, 400pe-3, 400pe-4.

According to various aspects, during a storage time, the polarization state the remanent-polarizable portion was initially residing in (in this exemplary case, the negative polarization state) may become favored over any other polarization state, for example, it may become an imprinted polarization state. During the storage time (e.g., at a time t1 subsequent to the time t0, for example after 1 hour, after 10 hours, after 1 day, after 10 days, etc.) the polarization properties of the remanent-polarizable portion may shift. Illustratively, during such period of time, the value of the first coercive field, $E_C^+$, may shift to an imprinted value of the first (e.g., positive) coercive field, $E_{C,IMP}^+$, and the value of the second coercive field, $E_C^-$, may shift to an imprinted value of the second (e.g., negative) coercive field, $E_{C,IMP}^-$. Moreover, during such period of time, the value of the first residual polarization, $P^+$, of the remanent-polarizable portion may shift to an imprinted value of the first (e.g., positive) residual polarization, $P_{IMP}^+$, and the value of the second residual polarization, $P^-$, may shift to an imprinted value of the second (e.g., negative) residual polarization, $P_{IMP}^-$. Illustratively, an actual value of the coercive field(s) and of the residual polarization(s) may be different from the respective predefined values. This is shown, for example, in FIG. 3B.

According to various aspects, the actual coercive field associated with the non-imprinted polarization state may be higher (e.g., it may have a greater absolute value) than a predefined coercive field associated with that polarization state. In various aspects, a non-imprinted polarization state may include a polarization state of a remanent-polarizable portion in an imprinted condition other than the imprinted (e.g., favored) polarization state. In this exemplary case, the actual positive coercive field, $E_{C,IMP}^+$, may be higher than the predefined positive coercive field, $E_C^+$. Thus, a higher (e.g., more positive) electric field may be required to switch the polarization state of the remanent-polarizable portion from the negative polarization state (the imprinted polarization state) to the positive polarization state (the non-imprinted polarization state). Accordingly, an actual coercive field associated with an imprinted polarization state may be lower (e.g., it may have a smaller absolute value) than a predefined coercive field associated with that polarization state. In this exemplary case, the actual negative coercive field, $E_{C,IMP}^-$, may be lower than the predefined negative coercive field, $E_C^-$. According to various aspects, the value of the positive coercive field, $E_C^+$, and the value of the negative coercive field, $E_C^-$, may thus shift towards more positive (or less negative) values during the storage time, in the case that the imprinted polarization state is a negative polarization state. Illustratively, it may be more energetically demanding to move away from the imprinted polarization state, and it may be less energetically demanding to bring the remanent-polarizable portion into the imprinted polarization state. The shift may be represented by a coercive field shift, $\Delta E_C$, which may be or represent the difference between the actual value of the positive coercive field, $E_{C,IMP}^+$, and the predefined value of the positive coercive field, $E_C^+$, or between the actual value of the negative coercive field, $E_{C,IMP}^-$, and the predefined value of the negative coercive field, $E_C^-$. According to various aspects, the coercive field shift, $\Delta E_C$, may be substantially the same for the positive coercive field, $E_C^+$, and the negative coercive field, $E_C^-$. The sign of the coercive field shift, $\Delta E_C$, (e.g., a direction of the shift) may depend on the imprinted polarization state (e.g., it may be positive for an imprinted negative polarization state, and it may be negative for an imprinted positive polarization state).

According to various aspects, the value of the actual residual polarization associated with the imprinted polarization state may be higher (e.g., it may have a greater absolute value) than the predefined value of the residual polarization for that polarization state. In this exemplary case, the actual value of the negative residual polarization, $P_{IMP}^-$, may be higher than the predefined value of the negative residual polarization, $P^-$, since the negative polarization state may have become favored during the storage time. Accordingly, the actual value of the residual polarization associated with a non-imprinted polarization state may be lower (e.g., it may have a smaller absolute value) than the predefined value of the residual polarization associated with that polarization state. In this exemplary case, the actual value of the positive residual polarization, $P_{IMP}^+$, may be lower than the predefined value of the positive residual polarization, $P^+$. According to various aspects, the positive residual polarization, $P^+$, and the negative residual polarization, $P^-$, may thus shift towards more negative (or less positive) values during the storage time, in the case that the imprinted polarization state is a negative polarization state. In various aspects, the shift may be represented by a positive residual polarization shift, $\Delta P^+$, which may be or represent the difference between the actual value of the positive residual polarization, $P_{IMP}^+$, and the predefined value of the positive residual polarization, $P^+$. In various aspects, the shift may be represented by a negative residual polarization shift, $\Delta P^-$, which may be or represent the difference between the actual value of the negative residual polarization, $P_{IMP}^-$, and the predefined value of the negative residual polarization, $P^-$. According to various aspects, the residual polarization shift associated with the imprinted polarization state may be smaller than the residual polarization shift associated with a non-imprinted polarization state. The value and the sign of a polarization shift may depend on the polarization state associated therewith. In this exemplary case, for an imprinted negative polarization state, the negative residual polarization shift, $\Delta P^-$, may be smaller than the positive residual polarization shift, $\Delta P^+$. As an explanation, a reduction of an absolute value of the predefined residual polarization associated with a non-imprinted polarization state may be greater than an increase of an absolute value of the predefined residual polarization associated with an imprinted polarization state. In this exemplary case, for an imprinted negative polarization state, a reduction of an absolute value of the positive residual polarization, $P^+$, may be greater than an increase of an absolute value of the negative residual polarization, $P^-$.

In some aspects, the absolute value of a coercive field associated with an imprinted memory state (e.g., a positive imprinted memory state) is lower than the absolute value of a coercive field associated with the same memory state without imprint (e.g., a positive non-imprinted memory state). In some aspects, the absolute value of the coercive field associated with the imprinted memory state is lower than the absolute value of a coercive field associated with the opposite memory state of the imprinted memory state (e.g., a negative memory state associated with the same memory window as the positive imprinted memory state).

Figure 3B:
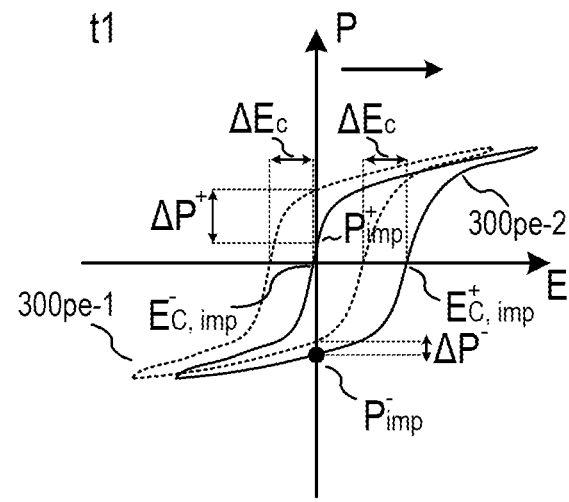
Figure 3C:
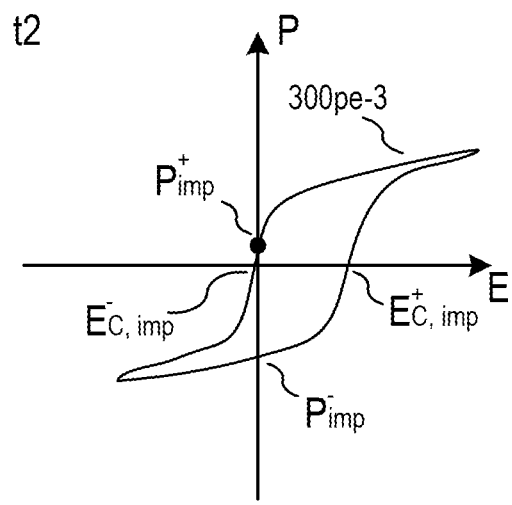
Figure 3D:
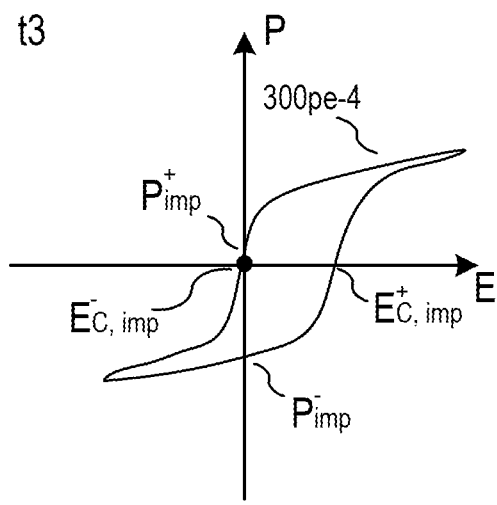

The imprinting may lead to issues in the case that the remanent-polarizable portion is brought (and stored) into the opposite polarization state with respect to the imprinted polarization state, as shown, for example, in FIG. 3C and FIG. 3D.

According to various aspects, the hysteresis loop 300pe-3 in FIG. 3C and the hysteresis loop 300pe-4 in FIG. 3D may describe that after the polarization state has been switched (e.g., in a conventional writing scheme) from the initial imprinted polarization state into the opposite non-imprinted polarization state, the polarization state of the remanent-polarizable portion may not be stable. Illustratively, the polarization properties of the remanent-polarizable portion may further shift, e.g. in the same direction as during the previous storage period. This may be due to the imprinted condition of the remanent-polarizable portion and/or to the lower actual absolute value of the residual polarization associated with the non-imprinted polarization state. Thus, the remanent-polarizable portion may not maintain such value of the residual polarization (e.g., the hysteresis curve may further shift). In this exemplary case, after the switch, the remanent-polarizable portion may have the actual positive residual polarization, $P_{IMP}^+$, in absence of an applied electric field, E, as shown, for example in FIG. 3C. Due to the lower absolute value of the imprinted positive residual polarization, $P_{IMP}^+$, with respect to a predefined (e.g., stable) value of the positive residual polarization, $P^+$, the remanent-polarizable portion may not maintain such value of the residual polarization. Further storage in this polarization state may lead to even stronger degradation and to a further depolarization (e.g., to a further reduction of the residual polarization of this polarization state). The actual value of the residual polarization may further decrease substantially to zero over time (e.g., at a time t3 subsequent to time t2, for example after 10 ms, after 10 s, after 10 min, etc.), as shown, for example, in FIG. 3D (e.g., the hysteresis loop 300pe-4 is further shifted towards more positive electric field values).

The memory state the memory cell is residing in may thus be not correctly determined, thus leading to a read fail due to imprinting of a polarization state. Only as an example, in some cases (e.g., to read out a capacitive memory cell) it may be useful to determine a memory state of a memory cell 200 based on detecting whether the memory cell 200 switches its memory state upon application of a read voltage (e.g., during a destructive read out) and causes a measurable switching current due to a switching charge. In such a case, a non-imprinted negative polarization state $P^-$ (see FIG. 3A) may be switched by an electric field (caused by the read voltage) higher than $E_C^+$ and thus may be identified (since a positive polarization state $P^+$ would not switch upon application of an electric field higher than $E_C^+$) as negative polarization state $P^-$ that defines a memory state of the memory cell 200. However, the same read voltage and thus the same electric field may not be sufficient to switch an imprinted negative polarization state $P_{IMP}^-$ (see FIG. 3B), since this would require an electric field higher than $E_{C,IMP}^+$ and thus, an imprinted negative polarization state $P_{IMP}^-$ may not be identified as negative polarization state which may lead to a read error.

FIG. 4A, FIG. 4B, FIG. 4C, and FIG. 4D respectively show a diagram illustrating polarization characteristics of a remanent-polarizable portion, similarly to FIG. 3A to FIG. 3D.

Figure 4A:
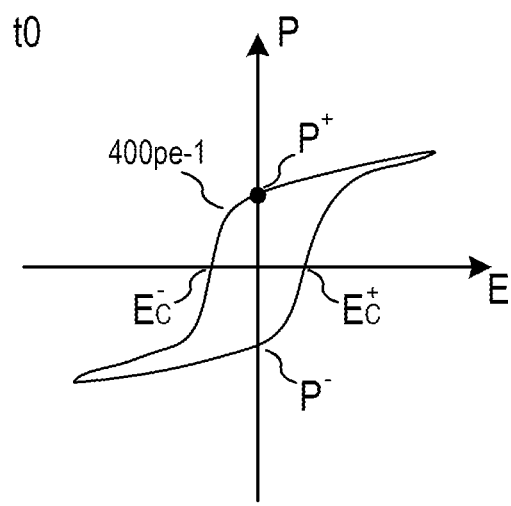

According to various aspects, FIG. 4A illustrates an exemplary predefined condition of a remanent-polarizable portion (e.g., a predefined condition of a memory cell including a remanent-polarizable portion), and may be analogous to FIG. 3A. The behavior over time of the remanent-polarizable portion will now be described in more detail assuming, as an exemplary case, that the remanent-polarizable portion is residing, at a time t0, in the positive polarization state. It is thus assumed that the remanent-polarizable portion has positive residual polarization, $P^+$, in absence of an applied electric field, E, as illustratively represented by the black dot in FIG. 4A. This may represent an opposite scenario with respect to the configuration described, for example, in relation to FIG. 3A.

Figure 4B:
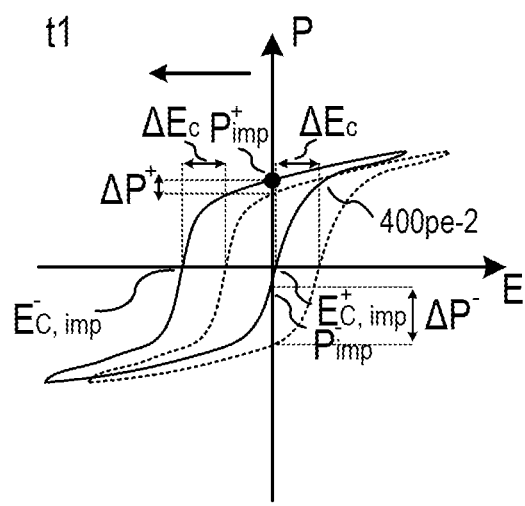

In this exemplary case, after a storage time, as shown in FIG. 4B, the actual negative coercive field, $E_{C,IMP}^-$, may be higher (e.g., it may have a greater absolute value) than the predefined negative coercive field, $E_C^-$. Thus, a higher (e.g., more negative) electric field may be required to switch the polarization state of the remanent-polarizable portion from the positive polarization state (the imprinted polarization state) to the negative polarization state (the non-imprinted polarization state). Accordingly, the actual positive coercive field, $E_{C,IMP}^+$, may be lower than the predefined positive coercive field, $E_C^+$. According to various aspects, the value of the positive coercive field, $E_C^+$, and the value of the negative coercive field, $E_C^-$, may thus shift towards more negative (or less positive) values during the storage time, in the case that the imprinted polarization state is a positive polarization state. The sign of the coercive field shift, $\Delta E_C$, may for example be opposite with respect to the coercive field shift describe above in relation to FIG. 3B.

As also shown in FIG. 4B, in this exemplary case, the actual value of the positive residual polarization, $P_{IMP}^+$, may be higher than the predefined value of the positive residual polarization, $P^+$, since the positive polarization state may have become favored during the storage time. Accordingly, the actual value of the negative residual polarization, $P_{IMP}^-$, may be lower than the predefined value of the negative residual polarization, $P^-$. According to various aspects, the positive residual polarization, $P^+$, and the negative residual polarization, $P^-$, may thus shift towards more positive (or less negative) values during the storage time, in the case that the imprinted polarization state is a positive polarization state. In this case, for an imprinted positive polarization state, the negative residual polarization shift, $\Delta P^-$, may be greater than the positive residual polarization shift, $\Delta P^+$. For an imprinted positive polarization state, a reduction of an absolute value of the negative residual polarization, $P^-$, may be greater than an increase of an absolute value of the positive residual polarization, $P^+$.

Figure 4C:
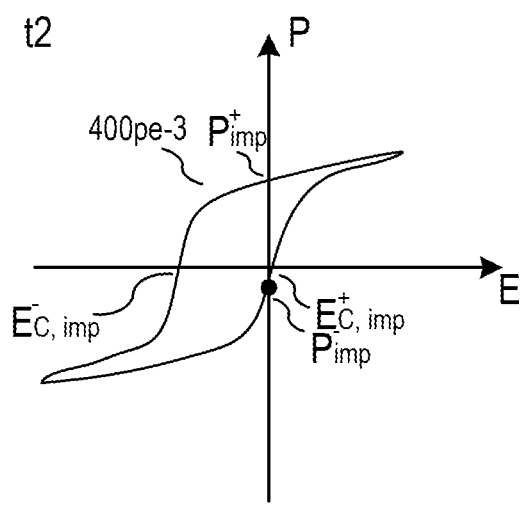
Figure 4D:
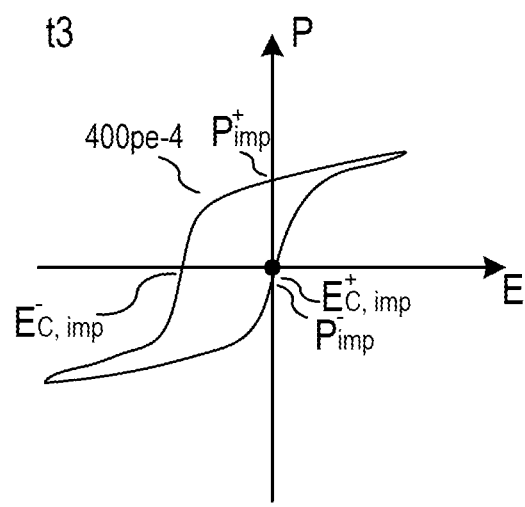

The imprinting may lead to issues in the case that the remanent-polarizable portion is brought (and stored) into the opposite polarization state with respect to the imprinted polarization state, as shown, for example, in FIG. 4C and FIG. 4D.

According to various aspects, the hysteresis loop 400pe-3 in FIG. 4C and the hysteresis loop 400pe-4 in FIG. 4D may describe that after the polarization state has been switched (e.g., in a conventional writing scheme) from the initial imprinted polarization state into the opposite non-imprinted polarization state, the polarization state of the remanent-polarizable portion may not be stable. In this exemplary case, after the switch the remanent-polarizable portion may have the actual negative residual polarization, $P_{IMP}^-$, in absence of an applied electric field, E, as shown, for example in FIG. 4C. Due to the lower absolute value of the imprinted negative residual polarization, $P_{IMP}^-$, with respect to a predefined value of the negative residual polarization, $P^-$, the remanent-polarizable portion may not maintain such value of the residual polarization. Further storage in this polarization state may lead to even stronger degradation and the actual value of the residual polarization may further decrease substantially to zero over time (e.g., at a time t3 subsequent to time t2), as shown, for example, in FIG. 4D (e.g., the hysteresis loop 400pe-4 is further shifted towards more positive electric field values).

The memory state the memory cell is residing in may thus be not correctly determined, thus leading to a read fail due to imprinting of a polarization state. Only as an example, in some cases (e.g., to read out a capacitive memory cell) it may be useful to determine a memory state of a memory cell 200 based on detecting whether the memory cell 200 switches its memory state upon application of a read voltage (e.g., during a destructive read out) and causes a measurable switching current due to a switching charge. In such a case, a non-imprinted positive polarization state P$^+$ (see FIG. 4A) may be switched by an electric field (caused by the read voltage) lower (more negative) than $E_C^-$ and thus may be identified (since a negative polarization state P$^-$ would not switch upon application of an electric field lower than $E_C^-$) as positive polarization state P$^+$ that defines a memory state of the memory cell 200. However, the same read voltage and thus the same electric field may not be sufficient to switch an imprinted positive polarization state $P_{IMP}^+$ (see FIG. 4B), since this would require an electric field lower than $E_{C,IMP}^-$ and thus, an imprinted positive polarization state $P_{IMP}^+$ may not be identified as positive polarization state which may lead to a read error.

According to various aspects, a conditioned read scheme described herein may reduce or substantially eliminate the occurrences of read fails by conditioning the memory cells to be read during a destructive read operation. Illustratively, a conditioned read scheme described herein may be configured to substantially eliminate imprint related effects or other effects occurring during a storage period, as will be discussed in further detail below.

Figure 5A:
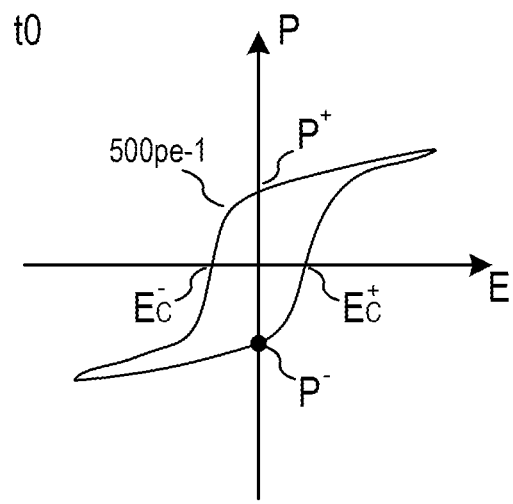
Figure 5B:
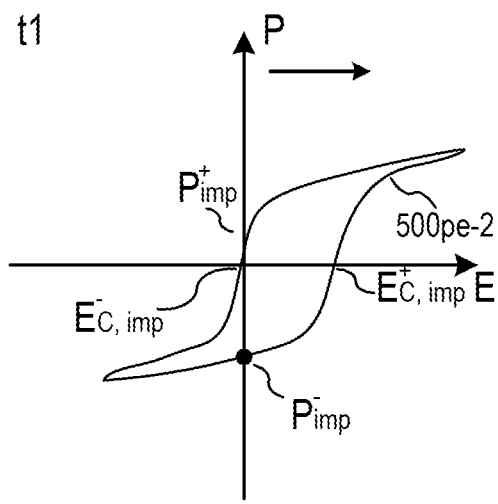
Figure 5C:
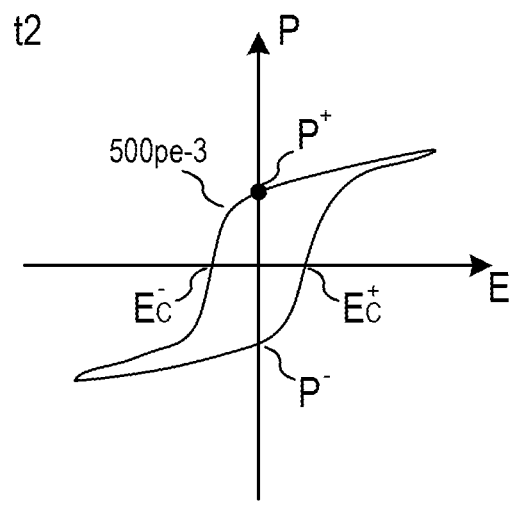

FIG. 5A, FIG. 5B, and FIG. 5C respectively show a diagram illustrating polarization characteristics of a remanent-polarizable portion. According to various aspects, a conditioned read scheme may be applied to read out a memory cell including a memory element with a remanent polarizable portion to avoid read failures due to imprint effects or due to other effects influencing the memory cell. The conditioned read scheme may be a destructive read scheme configured to compensate for and/or substantially eliminate imprint related effects or other effects that may shift a polarization state of a remanent polarizable portion during a storage period.

According to various aspects, FIG. 5A illustrates an exemplary predefined condition of a remanent-polarizable portion (e.g., a predefined condition of a remanent-polarizable portion without imprint effects). The behavior over time of the remanent-polarizable portion will now be described in more detail assuming, as an exemplary case, that the remanent-polarizable portion is residing, at a time t0, in the negative polarization state. This may represent a similar scenario as described, for example, in relation to FIG. 3A.

As shown in FIG. 5B, after a storage time, the negative polarization state may become favored (similar to the description above in relation to FIG. 3B). In this case, the actual value of the negative coercive field, $E_{C,IMP}^-$, may be smaller than the predefined value of the negative coercive field, $E_C^-$. Accordingly, the actual value of the positive coercive field, $E_{C,IMP}^+$, may be greater than the predefined value of the positive coercive field, $E_C^+$. As also shown in FIG. 5B, in this exemplary case, the actual value of the positive residual polarization, $P_{IMP}^+$, may be lower than the predefined value of the positive residual polarization, P$^+$. Accordingly, the actual value of the negative residual polarization, $P_{IMP}^-$, may be higher (e.g. greater) than the predefined value of the negative residual polarization, P$^-$.

According to various aspects, during or after a storage time, an actual value of the (e.g. positive and/or negative) coercive field, $E_C$, may shift to more than 150% of its predefined (e.g. initial) value, for example to more than 200% or to more than 250%. As an example, the predefined value of the positive coercive field, $E_C^+$, may be 1 MV/cm, and the actual value of the positive coercive field, $E_C^+$, may be higher than 1.5 MV/cm, for example, higher than 2 MV/cm or higher than 2.5 MV/cm. During or after a storage time, also an actual value of the (e.g. positive or negative) residual polarization may shift to more than 110% of its predefined value, for example to more than 150% or to more than 200%.

According to various aspects, the conditioned read scheme described herein may be configured to reduce or substantially eliminate a change of the polarization properties of a remanent-polarizable portion during the read operation. According to various aspects, a read signal may be configured to bring the actual polarization properties of the remanent-polarizable portion back to the respective pre-defined values (or at least to shift the polarization properties towards the respective predefined values). According to various aspects, the read signal may include one or more voltage pulses supplied to a remanent-polarizable portion to modify the remanent-polarizable portion. In various aspects, the read signal may be configured to modify the remanent-polarizable portion such that an actual value of the first coercive field, $E_C^+$, and/or of the second coercive field, $E_C^-$, of the remanent-polarizable portion is shifted to a predefined value associated with the respective coercive field. In various aspects, the read signal may be configured to modify the remanent-polarizable portion such that an actual value of the first residual polarization, P$^+$, and/or of the second residual polarization, P$_-$, of the remanent-polarizable portion is shifted to a predefined value associated with the respective residual polarization. Illustratively, the read signal may be configured to center (e.g., around an origin) a hysteretic P-E curve of a remanent-polarizable portion (e.g., of a memory cell). A de-centered hysteresis curve of a remanent-polarizable portion (for example the diagram 500pe-2 shown in FIG. 5B) may be centered (for example the diagram 500pe-3 shown in FIG. 5C) during or at least after the read operation has been carried out.

In some aspects, bipolar switching cycles may re-center the hysteresis loop of a ferroelectric material gradually on a logarithmic scale (with reference to time and/or number of pulse and/or on-time). Therefore, a few first cycles (e.g., 1 to 10 or 1 to 5 cycles) may have a substantive re-centering effect while a greater number may have less and less influence on the re-centering process.

In some aspects, a re-centering process based on one or more bipolar voltage drops of a ferroelectric material may be used on demand, in predefined time intervals, after a pre-defined number of read and/or write operations, only as examples.

Illustratively, before the read signal is applied to a (e.g., imprinted) remanent-polarizable portion an actual first absolute value of a first (e.g., in this case positive) coercive field may be greater than an actual second absolute value of a second (e.g., in this case negative) coercive field. The read signal may be configured such that after the read signal has been applied, the actual first absolute value of the first coercive field may be substantially equal to the actual second absolute value of the second coercive field (e.g., the first absolute value and the second absolute value may be substantially equal to the respective predefined values). Illustratively, the read signal may be configured to reduce substantially to zero a coercive field shift, $\Delta E_C$, of the remanent-polarizable portion.

According to various aspects, the read signal may be configured such that the actual first absolute value of the first coercive field and/or the actual second absolute value of the second coercive field may be shifted by more than 25% of the respective actual value, for example, more than 50%, for example, more than 100%, towards the respective predefined value. According to various aspects, the read signal may be configured such that after the read signal has been applied a difference between the actual absolute value of the (e.g. first and/or second) coercive field and the respective predefined absolute value may be less than 100% of the predefined absolute value, for example, e less than 50%, for example less than 25%. As an example, in the case that the predefined absolute value of the (e.g. first and/or second) coercive field is 1 MV/cm and during a storage time shifts to an imprinted coercive field of 2.5 MV/cm, the read signal may be configured such that after the read signal has been applied the actual absolute value may be in the range between 1 MV/cm and 2 MV/cm, e.g., in the range between 1 MV/cm and 1.5 MV/cm.

According to various aspects, the read signal may be configured to reduce the actual absolute value of the residual polarization associated with the imprinted polarization state (in the exemplary case shown in FIG. 5B, this may be a reduction of the absolute value of the actual negative residual polarization, $P_{IMP}^-$). Accordingly, the read signal may be configured to increase the actual absolute value of the residual polarization associated with a polarization state other than the imprinted polarization state (e.g., opposite to the imprinted polarization state, in the exemplary case shown in FIG. 5B this may be an increase of the absolute value of the actual positive residual polarization, $P_{IMP}^+$). Illustratively, before the read signal is applied to a (e.g., imprinted) remanent-polarizable portion an actual first absolute value of a first (e.g., in this case negative) residual polarization may be greater than an actual second absolute value of a second (e.g., in this case positive) residual polarization. The read signal may be configured such that after the read signal has been applied, the actual first absolute value of the first residual polarization may be substantially equal to the actual second absolute value of the second residual polarization (e.g., the first absolute value and the second absolute value may be substantially equal to the respective predefined values). Illustratively, the read signal may be configured to reduce a first (e.g., positive) residual polarization shift, $\Delta P^+$, and a second (e.g., negative) residual polarization shift, $\Delta P^-$, substantially to zero.

According to various aspects, the read signal may be configured such that the actual first absolute value of the first residual polarization and/or the actual second absolute value of the second residual polarization may be shifted by more than 25% of the respective actual value, for example, more than 50%, for example, more than 100%, towards the respective predefined value. According to various aspects, the read signal may be configured such that after the read signal has been applied a difference between the actual absolute value of the (e.g. first and/or second) residual polarization and the respective predefined absolute value may be less than 100% of the predefined absolute value, for example less than 50%, for example less than 25%.

According to various aspects, during a storage time, the actual value of the first coercive field and the actual value of the second coercive field may be not shifted by the same amount but in the same direction away from the respective predefined value. Therefore, in some aspects, the read signal may be applied and during the application of the read signal, the actual value of the first coercive field and the actual value of the second coercive field are not shifted back by the same amount but at least in the same direction. As an example, the actual value of the first coercive field may be shifted more (or less) than the actual value of the second coercive field towards the respective predefined value during the application of the read signal. The same may apply for the residual polarization instead of the coercive field.

According to various aspects, the hysteresis loop 500pe-3 in FIG. 5C may illustrate an exemplary condition of the remanent-polarizable portion after (or while) a read signal (e.g., one or more bipolar read pulses) have been applied to the remanent-polarizable portion.

Illustratively, FIG. 5C may illustrate a condition of the remanent-polarizable portion at a time t2 subsequent to the time t1, wherein after the time t1 (or before or at the time t2) a read signal is (or has been) applied to the remanent-polarizable portion. In this exemplary case, with respect to the (shifted) hysteresis loop 500pe-2 shown in FIG. 5B, the polarization properties of the remanent-polarizable portion have been restored to the respective predefined values, cf. FIG. 5A. Imprint related effects or other effects affecting the remanent-polarizable portion may have thus been substantially removed (e.g., there may be no imprinted polarization state). As shown in FIG. 5C, an actual absolute value of the positive coercive field, $E_C^+$, may be substantially equal to an actual absolute value of the negative coercive field, $E_C^-$, and an actual absolute value of the positive residual polarization, $P^+$, may be substantially equal to an actual absolute value of the negative residual polarization, $P^-$.

Figure 6A:
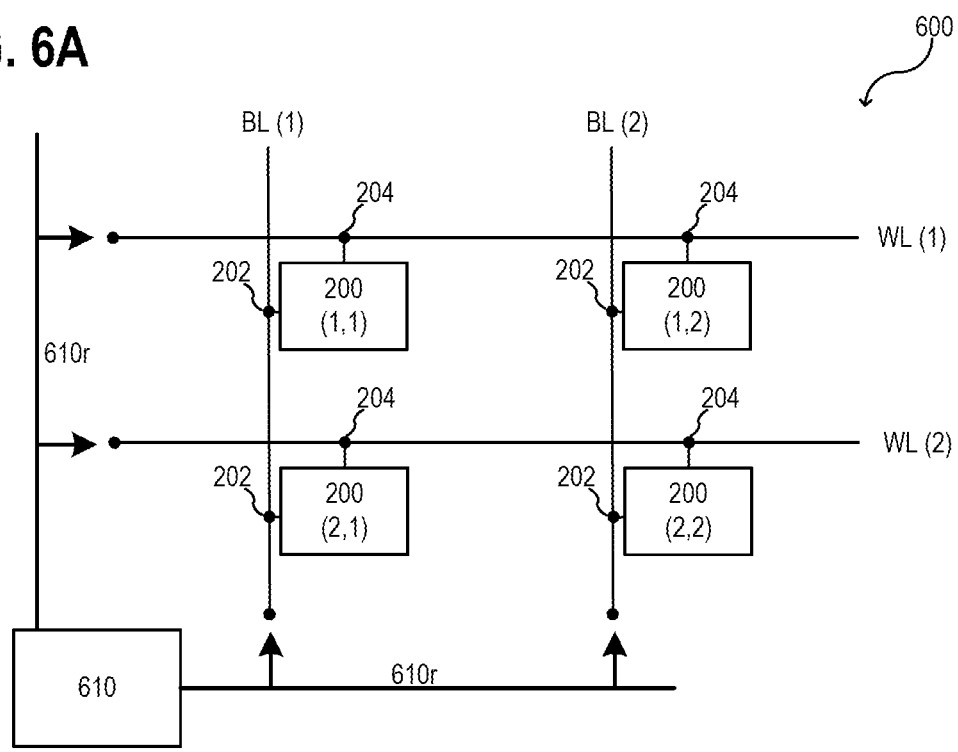
FIG. 6A and FIG. 6B schematically show various aspects of a memory device, e.g., of a memory cell arrangement including memory cells having each a memory element with a remanent polarizable portion.
Figure 6B:
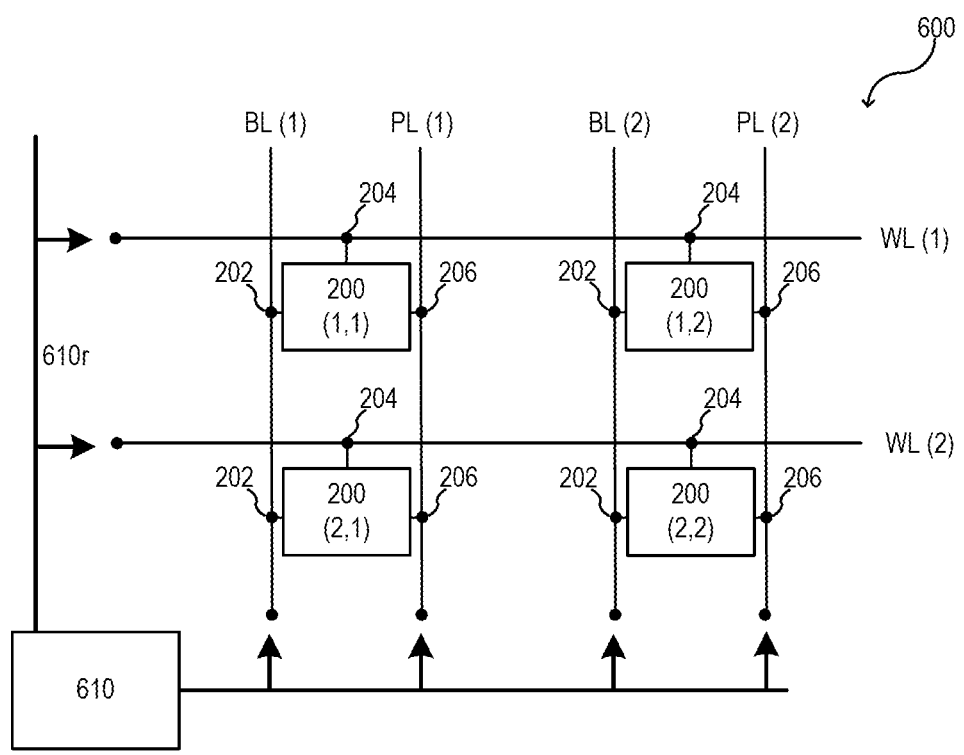

FIG. 6A and FIG. 6B respectively illustrate a memory device 600, according to various aspects. The memory cell 200 may include one or more memory cells 200 (e.g., a matrix of m times n memory cell 200, with m and n being natural numbers greater than one). Each of the memory cells 200 may include at least two terminals, e.g., a word-line terminal 204 and a bit-line terminal 202. Each of the memory cells may be configured as described herein with reference to memory cell 200 (see FIG. 2A and FIG. 2B, for example) or any other suit bale type of a capacitive memory cell.

FIG. 6A illustrates a set of two-terminal memory cells 200 (see FIG. 2A, for example) addressed by two sets of control lines, e.g., by a set of word-lines WL(1, 2, . . . ) and a set of bit-lines BL(1, 2, . . . ). FIG. 6B illustrates a set of three-terminal memory cells 200 (see FIG. 2B, for example) addressed by three sets of control lines, e.g., by a set of word-lines WL(1, 2, . . . ), a set of bit-lines BL(1, 2, . . . ), and a set of plate-lines PL(1, 2, . . . ).

The memory device 600 may include a memory controller 610, according to various aspects. The memory controller 610 may be configured to generate one or more read signals 610r to cause a destructive read operation. This may allow for a determination of an initial memory state of a memory element (and therefore, of the memory cell 200 including the memory element). As described herein, the memory element may include at least one remanent polarizable portion. According to various aspects, the destructive read operation may include causing an alternating sequence of voltage drops of opposite polarities over the at least one remanent polarizable portion of the memory element. The memory controller 610 of the memory device 600 may be further configured to determine the initial memory state of the memory element (and therefore, of the memory cell 200 including the memory element) based on an electrical behavior of the memory element caused by the alternating sequence of voltage drops as explained in more detail below. Furthermore, the memory controller 610 may be configured to bring the memory element of the memory cell 200 that is read by the destructive read operation into a predefined condition, e.g., imprint related effects may be reduced, e.g., removed. This may be achieved by the application of the alternating sequence of voltage drops that may shift the polarization window of the memory element (see FIG. 5B) back to a predefined condition (see FIG. 5C).

Figure 7A:
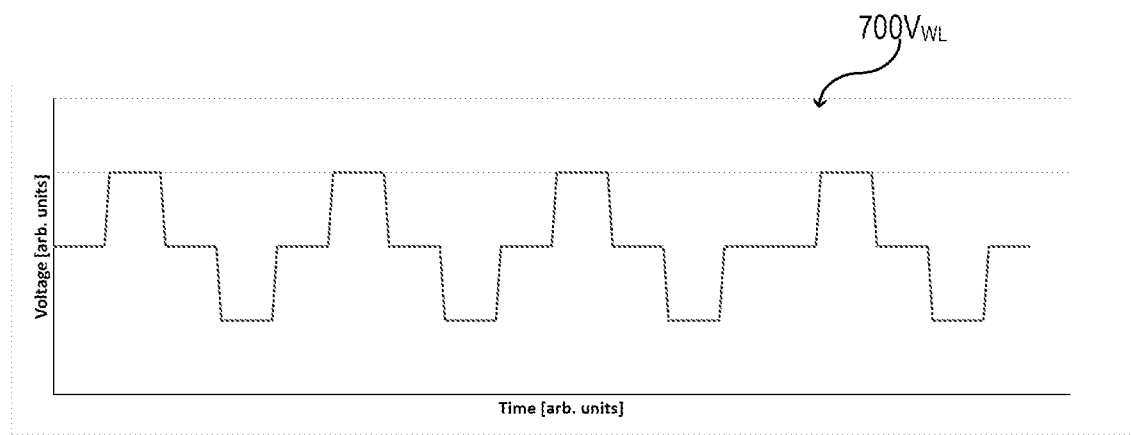
FIG. 7A and FIG. 7B show various aspects of control signals to generate a bipolar voltage drop sequence to read out a memory cell of a memory cell arrangement.
Figure 7B:
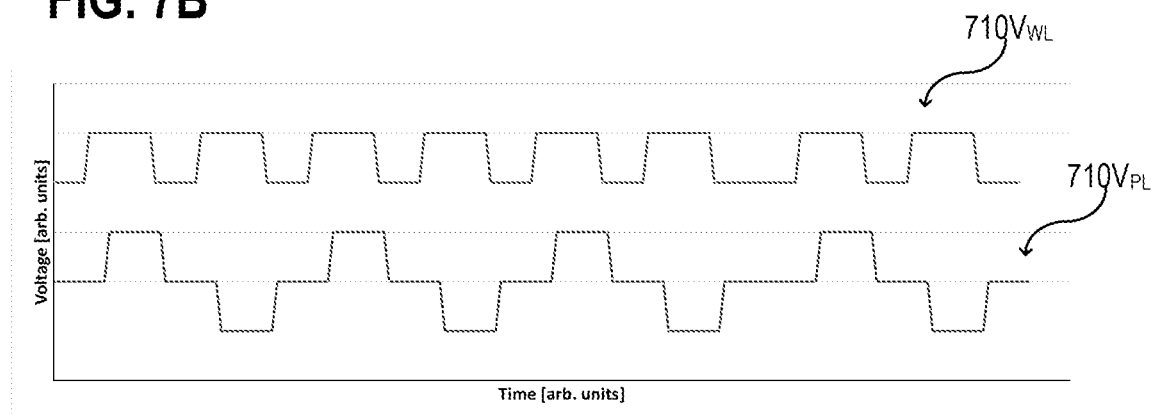

FIG. 7A and FIG. 7B respectively illustrate time dependent control voltages that may cause an alternating sequence of voltage drops over a remanent polarizable portion of a memory element or of memory cell, according to various aspects. As an example, an alternating control voltage may be supplied to one electrode of a memory element (see FIG. 1A) and a current or charge accumulation associated with another electrode of the memory element may be used to determine a switching behavior of the memory element 100 and therefore of the memory cell 200 including the memory element 100.

As an example, in the case that the remanent polarizable portion 106r of the memory element 100 is initially (prior to the destructive read operation) in a first polarization state (e.g., negative polarization state) and the alternating sequence of voltage drops starts with a positive voltage drop over the remanent polarizable portion 106r of the memory element 100, the remanent polarizable portion 106r is expected to switch its polarization state a first time upon application of the first positive voltage drop as well as upon each of the following voltage drops of the alternating sequence of voltage drops. In other words, an alternating sequence of a number of voltage drops may cause the same number of switchings of the remanent polarizable portion 106r. However, in the other case that the remanent polarizable portion 106r of the memory element 100 is initially (prior to the destructive read operation) in a second polarization state (e.g., positive polarization state) and the alternating sequence of voltage drops starts with a positive voltage drop over the remanent polarizable portion 106r of the memory element 100, the remanent polarizable portion 106r is expected to not switch its polarization state upon application of the first positive voltage drop of the alternating sequence of voltage drops but upon the first negative voltage drop of the alternating sequence of voltage drops as well as upon each of the following voltage drops of the alternating sequence of voltage drops.

In other words, an alternating sequence of a number of voltage drops may cause the number minus one switchings of the remanent polarizable portion 106r. Therefore, a number of switchings of the remanent polarizable portion 106r may be indicative for the memory state of the memory element 100 that is defined by the remanent polarization state thereof.

In the case that the alternating control voltage may be supplied to the second electrode 104 of the memory element 100, see FIG. 1A, the current or charge accumulation associated with the first electrode 102 of the memory element 100 may be a function of the number of switchings of the remanent polarizable portion 106r during the read out operation and may be, therefore, used to determine an initial memory state of the memory element 100 and accordingly, an initial memory state of the memory cell 200 including the memory element 100.

According to various aspects, the memory controller 610 of a memory device 600 may be configured to cause the alternating sequence of voltage drops. As an example, the memory controller 610 of the memory device 600 illustrated in FIG. 6A may be configured to supply an alternating word-line voltage $700V_{WL}$ to a word-line of a corresponding memory cell 200 to be read, see FIG. 7A. A charge or current accumulation at the bit-line of the corresponding memory cell 200 may be determined to read out the corresponding memory cell. In the case the memory cells 200 of the memory device 600 include an access device, as illustrated in FIG. 6B, for example, the memory controller 610 may be configured accordingly to supply the alternating plate-line voltage $710V_{PL}$ to a plate-line of a corresponding memory cell 200 to be read and a word-line voltage $710V_{WL}$ to open the corresponding access device of the memory cell 200 to be read (see FIG. 6B and FIG. 7B) to allow for a charge or current accumulation at the bit-line of the corresponding memory cell 200.

As explained in more detail below, the switching of the remanent polarizable portion of the memory element may be influenced by disturbing effects such as the imprint effect as described herein. Various aspects of a read out operation to read out a memory cell, as described herein, may be related to compensate for disturbing effects such as the imprint effect to ensure a reliably read out of the memory state in which the memory cell is residing in as described in more detail below.

Some reliability concerns of ferroelectric-based memory technology may be related to imprint effects. Imprint is a known effect related to a shift of the P⁻ E hysteresis along the field axis with increasing storage time. It may occur due to a re-ordering or re-charging of ionic, electronic or other defects, which can exist in the bulk and/or at the electrode interfaces of a ferroelectric thin film. The imprint effect may be accelerated at elevated temperatures. A read out voltage range may be fixed in an integrated device, e.g., a read voltage, $V_{read}$, may be selected within a range from $V_{read,min}$ to $V_{read,max}$. For non-imprinted or only weakly imprinted memory cells, such a read voltage may allow for a proper read out. However, a substantial imprint may lead to the problem that it may be not possible to fully switch a remanent polarizable portion of a memory element into an opposite state of the state stored previously which may lead to problems to determine the memory state of the memory cell based on a switching behavior of the memory cell. Ferroelectric-based memory technology may usually distinguish two polarization states from one another by a single unipolar read pulse, which causes a higher (switching) charge if the memory cell changes its polarization state due to the applied single unipolar read pulse or causes a lower (non-switching) charge if the memory cell does not change its polarization state due to the applied single unipolar read pulse, which allows for a determination of the memory state based on the caused higher (switching) charge or lower (non-switching) charge.

The read out operation described herein according to various aspects may be based on a bipolar read pulse sequence including a number of positive and a number of negative read voltage pulses; it is understood that the number of positive and negative read voltage pulses cause a bipolar voltage drop sequence (including a number of voltage drops having opposite polarities) over the memory element of the memory cell.

Such a bipolar read scheme may tolerate much larger imprints (e.g. double or more) than a conventional unipolar read scheme. A potential drawback of a bipolar read scheme may be that may be slower than a unipolar read scheme that only consists of a single pulse before a re-write operation is performed as required to maintain the original memory state stored after the read out. However, this may be compensated by adapting the length of the read pulses accordingly, as explained in more detail below. It is noted that a bipolar read out that causes a switching of a stored memory state during read out, as described herein, may be referred to as a destructive read out since the memory cell is, in some cases, after the read out in a different memory state than prior to the read out. According to various aspects, requirements of retention (e.g., "imprint"-hardness) may be more demanding than requirements for read out speed.

According to various aspects, a basic principle of the read out operation described herein may include a re-centering of the imprinted (biased) hysteresis loop of a remanent polarizable portion that is subjected to bipolar switching cycles during read out. This re-centering may proceed fairly quickly, especially during the first cycles of the read out and then slows down. It has a dependence of $\Delta V_{bias}$ on log (cycles) similar to the imprints of $\Delta V_{bias}$ dependence on log(time). This may include that lot of imprint can be removed rather quickly regaining a lot of log(time) for the next retention case of the same direction with just a few bipolar switching cycles during the read out. Hence, the read out scheme described herein may also serve as a re-initialization procedure for a next writing and storage period of the memory cell.

In some aspects, the imprint effect may generally increase a time that is necessary to switch an imprinted memory cell into the state that is not preferred due to the imprinting, whereas the state that is preferred due to the imprinting can be set easier. Using the bipolar read scheme as described herein may allow for a reduction of the length of the individual read pulses (compared to a conventional read scheme), since a re-centering and therefore an at least partial imprint removal is included in the read scheme. Therefore, imprint-related speed issues can be avoided and individual read pulses with only 10 ns or less duration can be used in the read scheme.

According to various aspects, a bipolar read operation is utilized that includes one, two or more cycles of positive and negative voltage pulses and an integration of a charge/current along rising edges and/or plateaus of the voltage pulses. Alternatively, an integration of a charge/current may be carried out continuously during the read out of a memory cell.

According to various aspects, a bipolar read with two cycles of positive and negative voltage pulses may work for moderate imprint by up to ~half $V_{DD}$. A bipolar voltage may be supplied between two electrodes on opposite sides of a remanent polarizable portion of a memory cell. A charge/current integration over the utilized number of bipolar read-pulses may be implemented via peripheral circuitry, e.g., via a (read out) memory controller of a memory device. According to various aspects, a re-write operation may follow the read operation to bring the memory cell that was read via the destructive read operation described herein back into its original memory state in which the memory cell was residing prior to (e.g., at the start of) the destructive read operation. Such re-writing procedures may include, only as an example, that a write voltage may be supplied to the memory element such that a write voltage drop over the remanent polarizable portion of the memory element may define the memory state into which the memory element is written.

FIG. 8A, FIG. 8B, FIG. 8C, and FIG. 8D show respectively a behavior of a bit-line voltage $V_{BL}$ associated with a memory cell to be read out via a destructive read operation as described herein, according to various aspects. In this exemplary illustration, the destructive read operation is based on a voltage drop sequence $V_d(s)$ that includes eight voltage drops, e.g., four positive voltage drops $V_d(1)$, $V_d(3)$, $V_d(5)$, $V_d(7)$ and four negative voltage drops $V_d(2)$, $V_d(4)$, $V_d(6)$, $V_d(8)$. Such a voltage drop sequence $V_d(s)$ may be caused by control voltages as described, for example, with reference to FIGS. 7A and 7B. The bit-line voltage $V_{BL}$ represents, during the destructive read operation, an integrated charge/current caused by the switching of the memory cell due to the applied bipolar read voltage drop. In some aspects, the integration of the charge/current during the destructive read operation may be configured to be continuously (see FIG. 8B and FIG. 8D) or only at certain time intervals that include at least the rising edges and/or the plateaus of the voltage pulses (see FIG. 8A and FIG. 8C). The charge/current integration may be controlled via a control signal (e.g., a continuous control voltage $V_{cc}$ or a pulsed control voltage $V_{cp}$). The control signal may be, in some aspects, supplied to the second terminal 204 of a three terminal memory cell (see, for example, FIG. 2B and FIG. 6B) to control the access device, e.g., the access field-effect transistor 210 of the memory cell during the destructive read operation. Each of the FIGS. 8A to 8D show a first behavior (1) of the bit-line voltage $V_{BL}$ that illustrate the case that the memory cell to be read out is initially in a first memory state (e.g., in a negative state) and a second behavior (2) of the bit-line voltage $V_{BL}$ that illustrate the case that the memory cell to be read out is initially in a second memory state (e.g., in a positive state). As can be seen, the bit-line voltage $V_{BL}$ is indicative of the respective initial memory state since the first behavior (1) is different from the second behavior (2), as described herein.

Figure 8A:
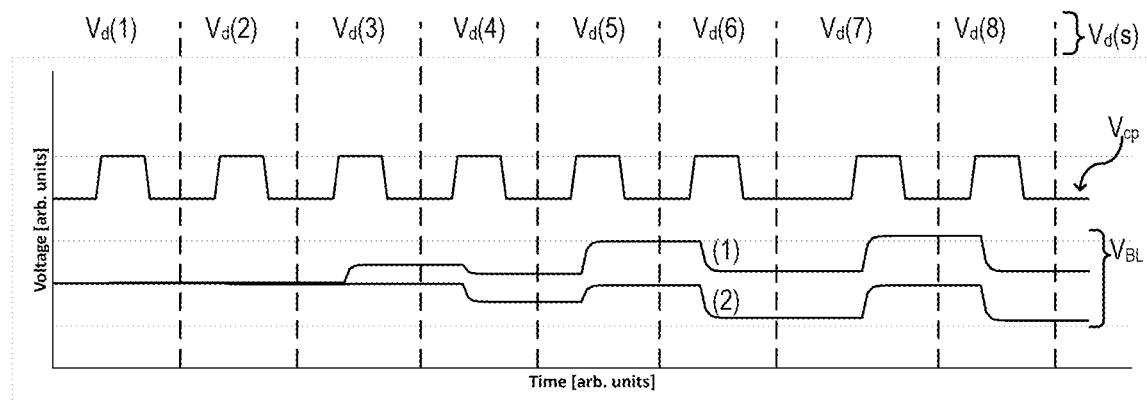
FIG. 8A to FIG. 8D show various aspects of read out signals caused during a destructive read out operation based on a bipolar voltage drop sequence.
Figure 8B:
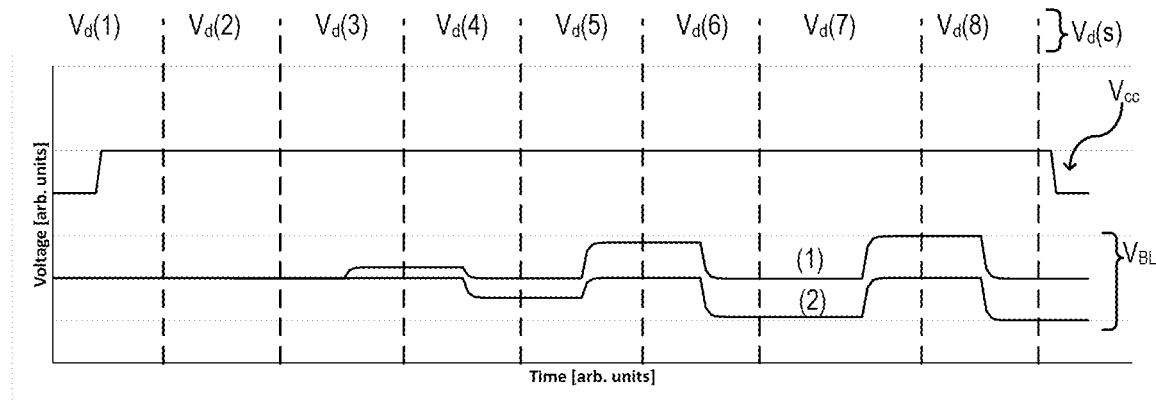
Figure 8C:
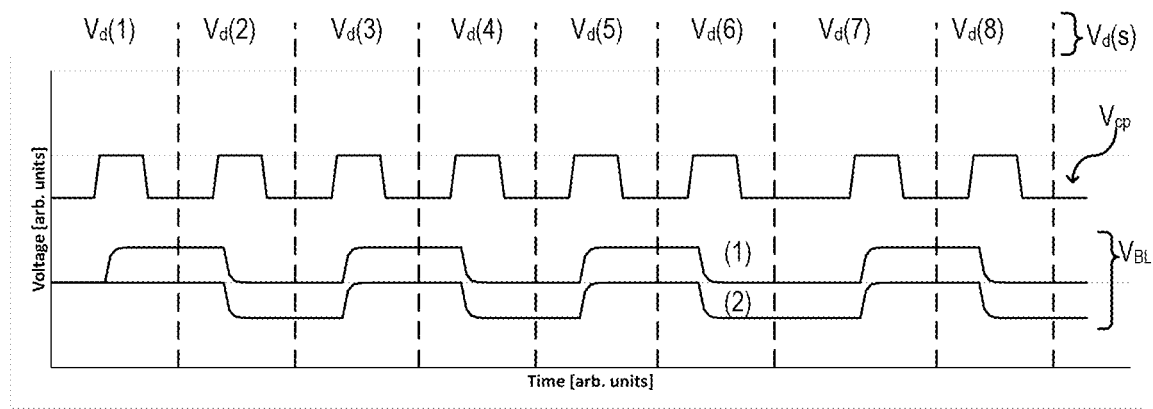
Figure 8D:
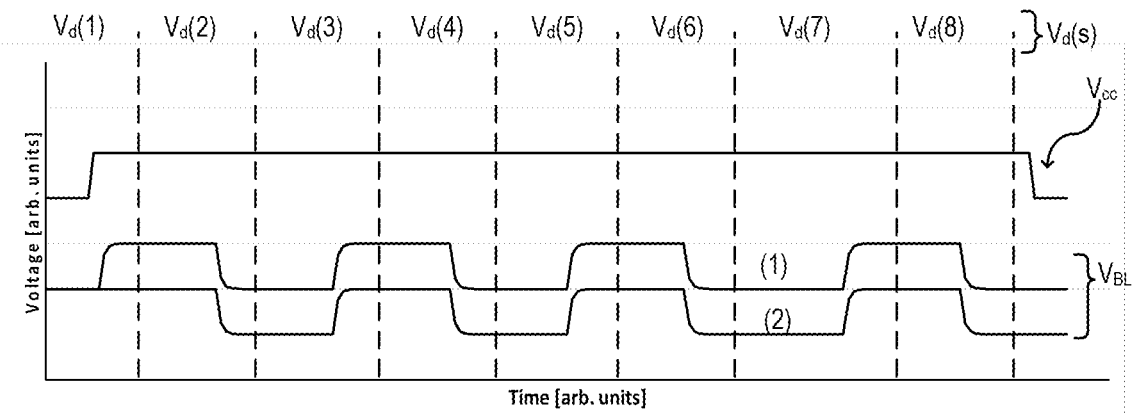

To illustrate a possible advantage of the advanced type of destructive read operation described herein, according to various aspects, FIG. 8A and FIG. 8B show graphs for bit-line voltages $V_{BL}$ associated with a read out of an imprinted memory cell, and, for comparison, FIG. 8C and FIG. 8D show similar graphs associated with a read out of a non-imprinted memory cell.

As shown in FIG. 8C and FIG. 8D, for a non-imprinted memory cell, an initial memory state of the memory cell can be determined immediately after a first voltage drop (e.g., after a positive voltage drop $V_d(1)$) was generated over the remanent polarizable portion of the memory cell. The bit-line is charged to a first voltage or a second voltage as a function of the memory state in which the memory cell is residing in, as described above.

Only as an example, in the case that the non-imprinted memory cell is in a negative state prior to the application of the first (positive) voltage drop $V_d(1)$, the bit-line is charged to a first voltage since the non-imprinted memory cell is switched by the first (positive) voltage drop $V_d(1)$ into a positive state whereas a non-imprinted memory cell that is in a positive state prior to the application of the first (positive) voltage drop $V_d(1)$ is not switched by the first (positive) voltage drop $V_d(1)$ such that the bit-line is charged to a second voltage (or remains at a same voltage). During the application of the subsequent voltage drops the difference in the bit-line voltage remains as a function of the initial memory state of the memory cell.

Therefore, for non-imprinted memory cells, a single unipolar read out can be used to determine a memory state of the memory cell. However, a bipolar read out as described herein may be used to read out non-imprinted memory cells with a high reliability.

In contrast to a non-imprinted memory cell, an imprinted memory cell that is in a negative state prior to the application of the first (positive) voltage drop $V_d(1)$ may not be switched by the first voltage drop $V_d(1)$, as shown in FIG. 8A and FIG. 8B. Therefore, the bit-line is not charged to a voltage that is indicative for the initial memory state in which the memory cell is residing in, as described above. Therefore, for imprinted memory cells, a single uni-polar read out cannot be used to reliably determine a memory state of the memory cell. A similar behavior can be seen in the case that the imprinted memory cell is in a positive state prior to the application of the first (positive) voltage drop $V_d(1)$, wherein such a memory cell may not be switched by the first voltage drop $V_d(1)$ (as expected) but may also not switch upon application of the second (negative) voltage drop $V_d(2)$ of the voltage drop sequence $V_d(s)$, as shown in FIG. 8A and FIG. 8B. Therefore, a bipolar read out as described herein may be used to read out memory cell that may be subjected to an imprint effect, as described in more detail below.

As can be seen in FIGS. 8A and 8B, the imprint effect is gradually removed from the memory cell during the read out by the sequence of positive and negative voltage drops. Therefore, an imprinted memory cell that is in a negative state prior to the application of the first (positive) voltage drop $V_d(1)$ may at least partially switch during application of the third voltage drop $V_d(3)$, which is a positive voltage drop since the imprint effect is partially removed by the application of the first and second voltage drop of the voltage drop sequence (see behavior (1)). Moreover, the imprinted memory cell that is in a negative state prior to the application of the first (positive) voltage drop $V_d(1)$ may switch gradually more and more during application of the subsequent voltage drops since the imprint effect is more and more removed by the application of the voltage drops of the voltage drop sequence. A similar behavior (see behavior (2)) can be seen in the case that the imprinted memory cell is in a positive state prior to the application of the first (positive) voltage drop $V_d(1)$, wherein such a memory cell may be partially switched by the fourth voltage drop $V_d^{(4)}$ and may be switched gradually more and more during application of the subsequent voltage drops since the imprint effect is more and more removed by the application of the voltage drops of the voltage drop sequence.

Therefore, using a bipolar voltage drop sequence, as described herein, may allow for a reliable read out of memory cells that may be subjected to an imprint effect. The substantial removal or reduction of the imprint effect of a memory cell is illustrated in various figures based on current/voltage characteristics as well as polarization/voltage characteristics as explained in more detail below. The figures illustrate the behavior of a memory cell during a destructive bipolar read out operation as a function of a strength of an imprint effect, wherein a time sequence is related thereto represented by a first graph G1 associated with an initial condition of the memory cell, a second graph G2 associated with a condition of the memory cell during application of the first and second voltage drop $V_d(1)$, $V_d(2)$, a third graph G3 associated with a condition of the memory cell during application of the third and fourth voltage drop $V_d(3)$, $V_d(4)$, and a fourth graph G4 associated with a condition of the memory cell during application of the last two voltage drops (e.g., $V_d(7)$, $V_d(8)$ of the voltage drop sequence VA(s).

Figure 9A:
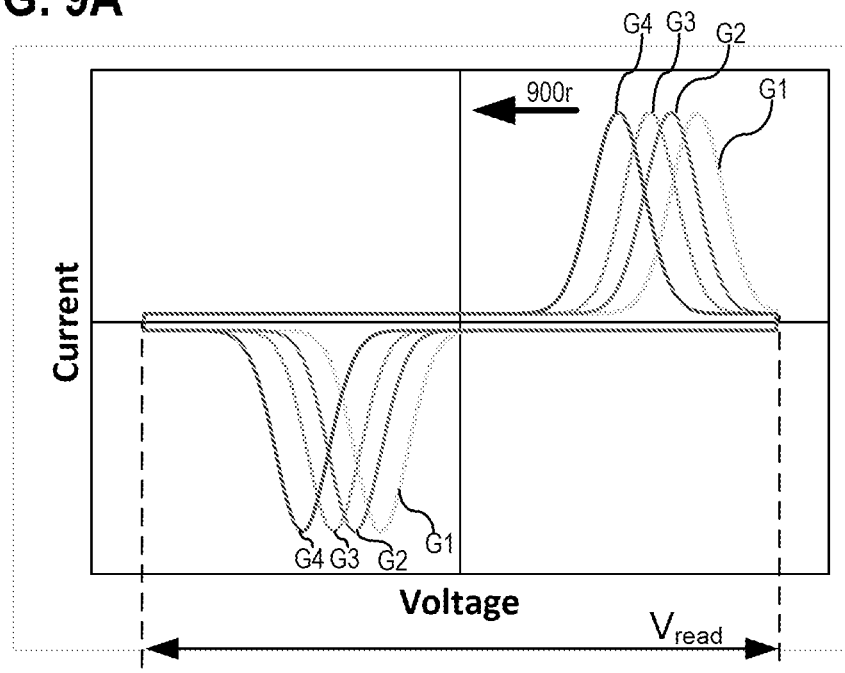
FIG. 9A to FIG. 9D show various aspects of current/voltage and polarization/voltage properties of a memory element with a remanent polarizable portion during a destructive read out operation based on a bipolar voltage drop sequence.
Figure 9B:
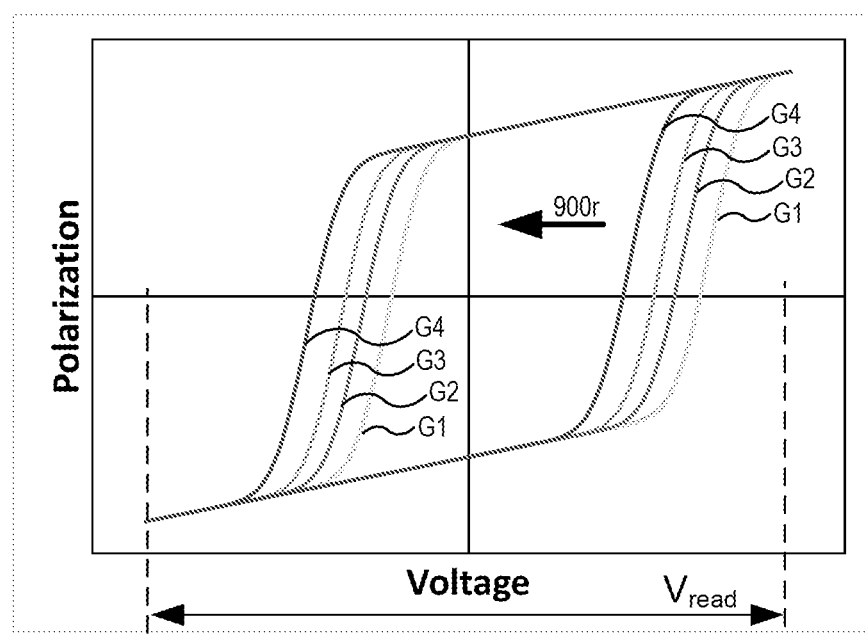
Figure 9C:
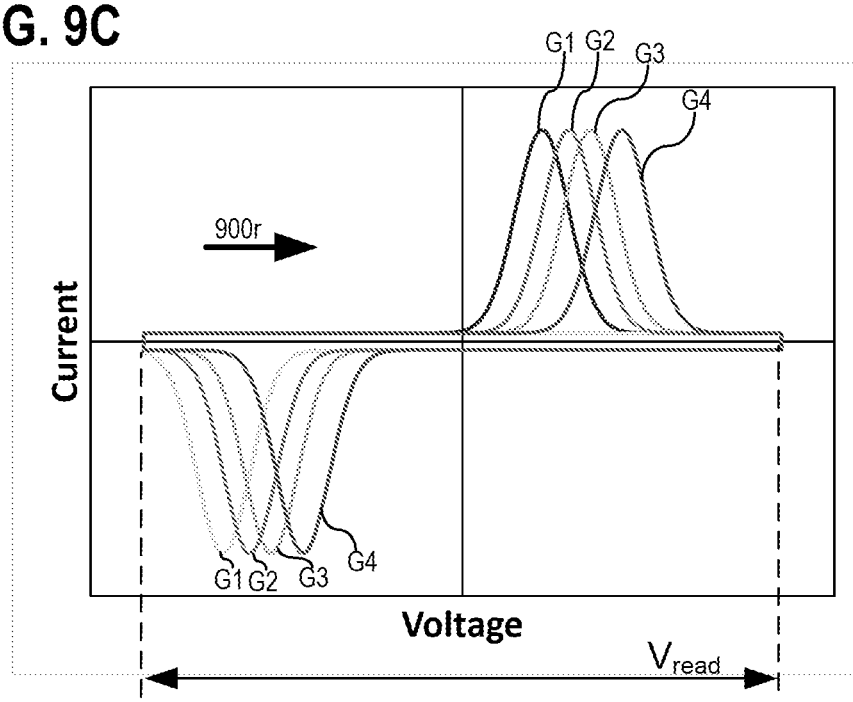
Figure 9D:
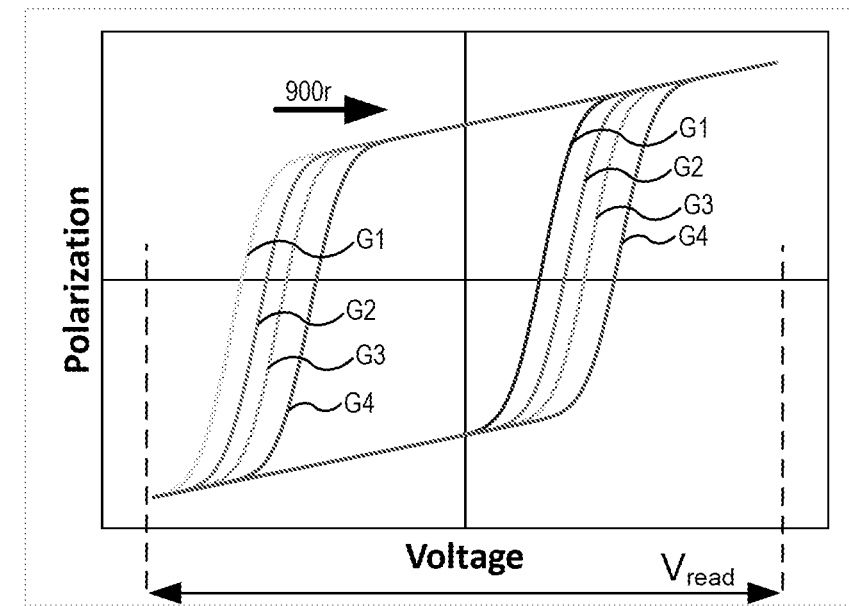

FIG. 9A illustrates current/voltage characteristics and FIG. 9B illustrates polarization/voltage characteristics for a memory cell with no or only a low positive imprint. FIG. 9C illustrates current/voltage characteristics and FIG. 9D illustrates polarization/voltage characteristics for a memory cell with no or only a low negative imprint. Since the memory cell shows no substantial imprint effect, the memory cell may switch as expected within the read voltage window as explained with reference to FIG. 8C and FIG. 8D. However, in addition to the reliable read out characteristics, the actual memory window of the memory cell is at least partially re-centered 900r by the voltage drops of the bipolar voltage drop sequence (see graphs G4 in FIGS. 9A to 9D).

FIG. 10A, FIG. 10C, FIG. 10E, and FIG. 10G illustrate current/voltage characteristics and FIG. 10B, FIG. 10D, FIG. 10F, and FIG. 10H illustrate polarization/voltage characteristics for a memory cell with a substantive positive imprint. FIG. 11A, FIG. 11C, FIG. 11E, and FIG. 11G illustrate current/voltage characteristics and FIG. 11B, FIG. 11D, FIG. 11F, and FIG. 11H illustrate polarization/voltage characteristics for a memory cell with a substantive negative imprint.

Figure 10A:
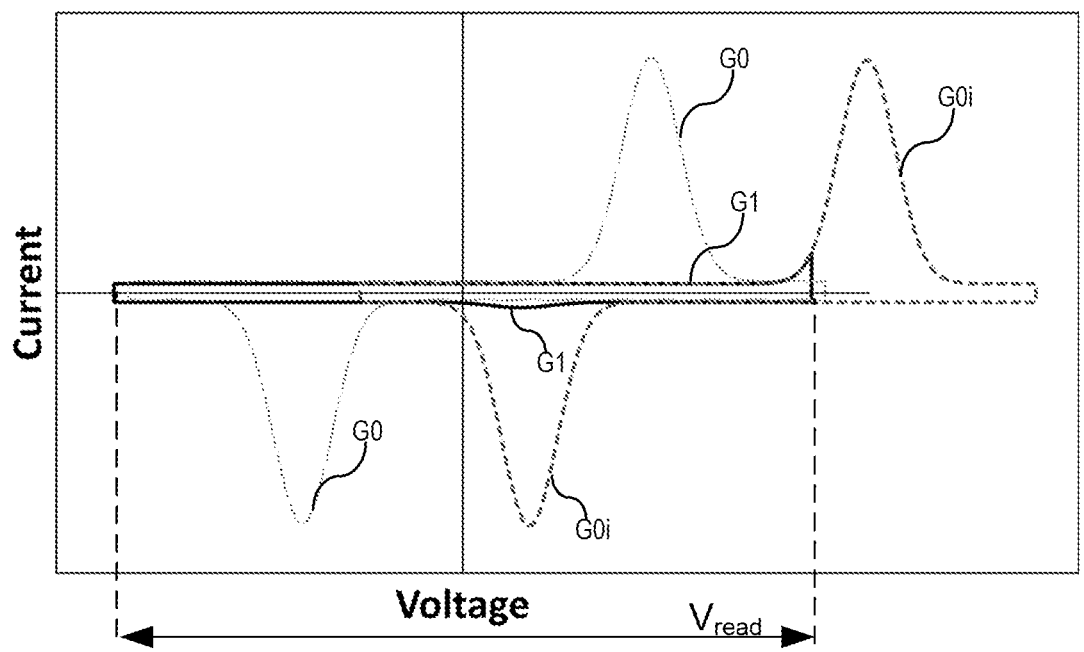
FIG. 10A to FIG. 10H show various aspects of current/voltage and polarization/voltage properties of a memory element with a remanent polarizable portion during a destructive read out operation based on a bipolar voltage drop sequence.
Figure 10B:
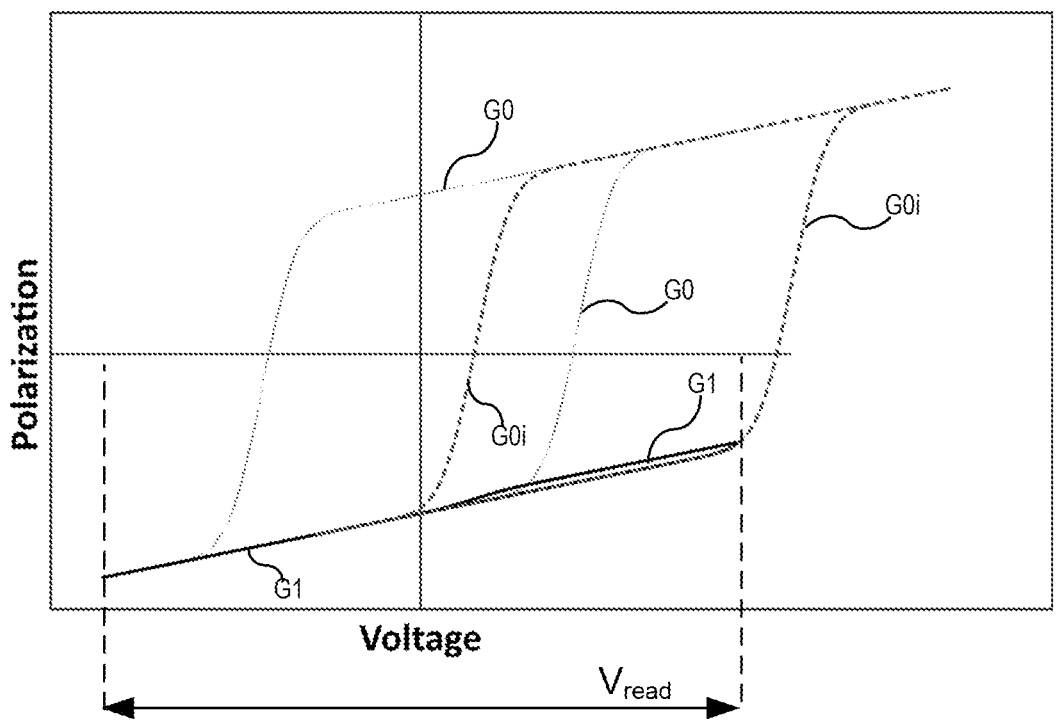
Figure 10C:
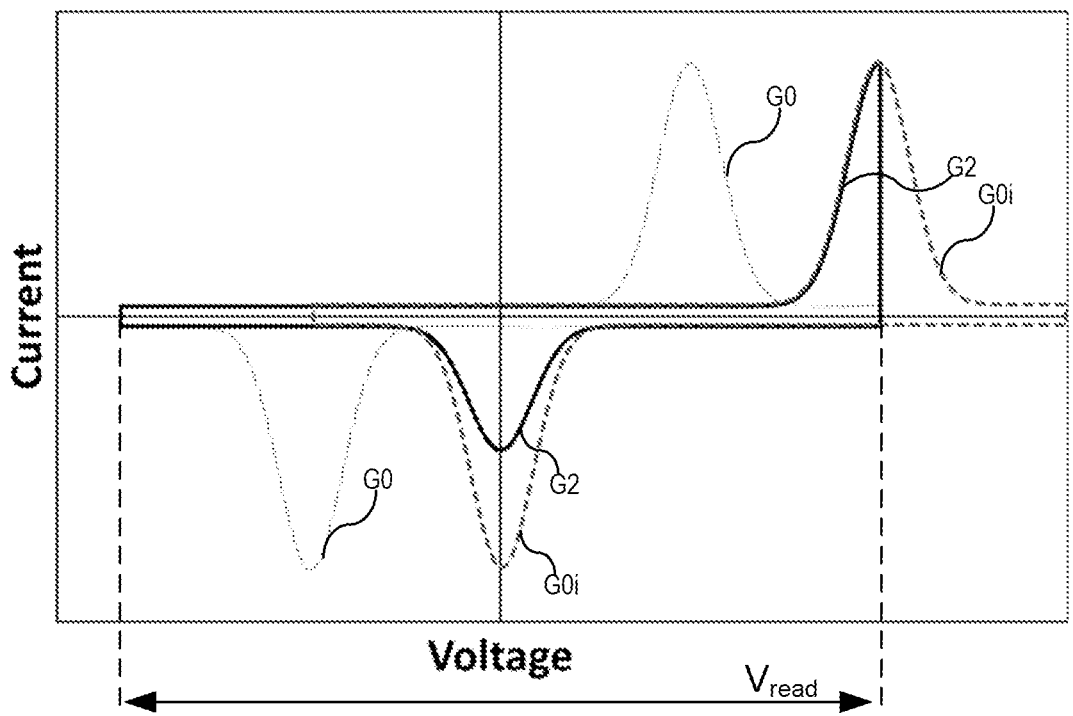
Figure 10D:
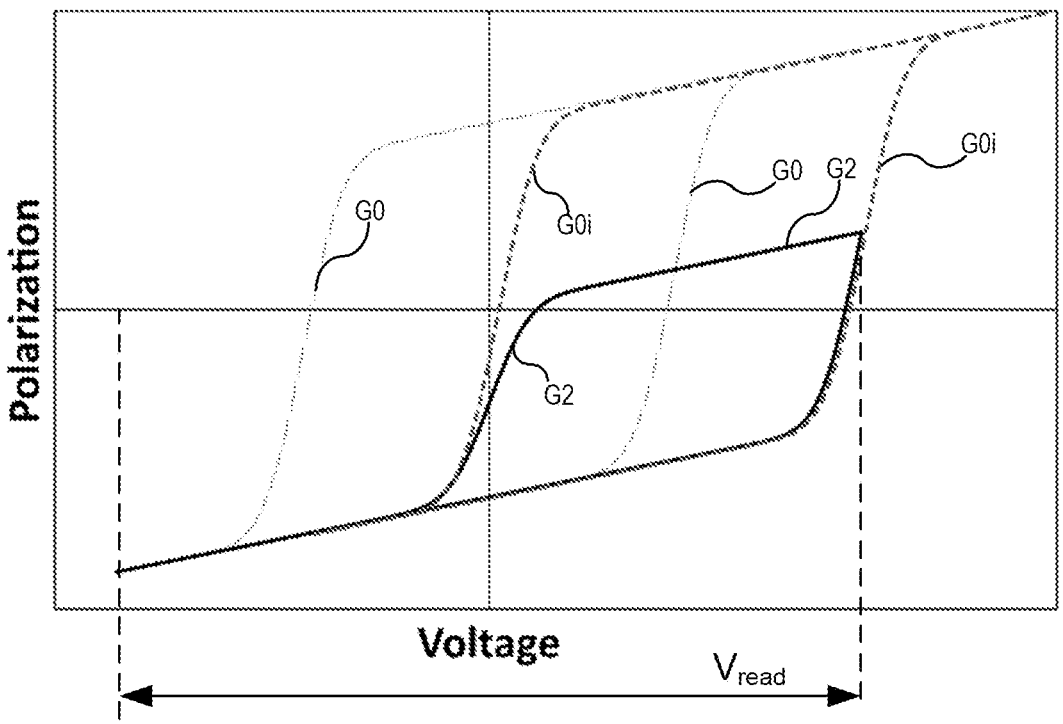
Figure 10E:
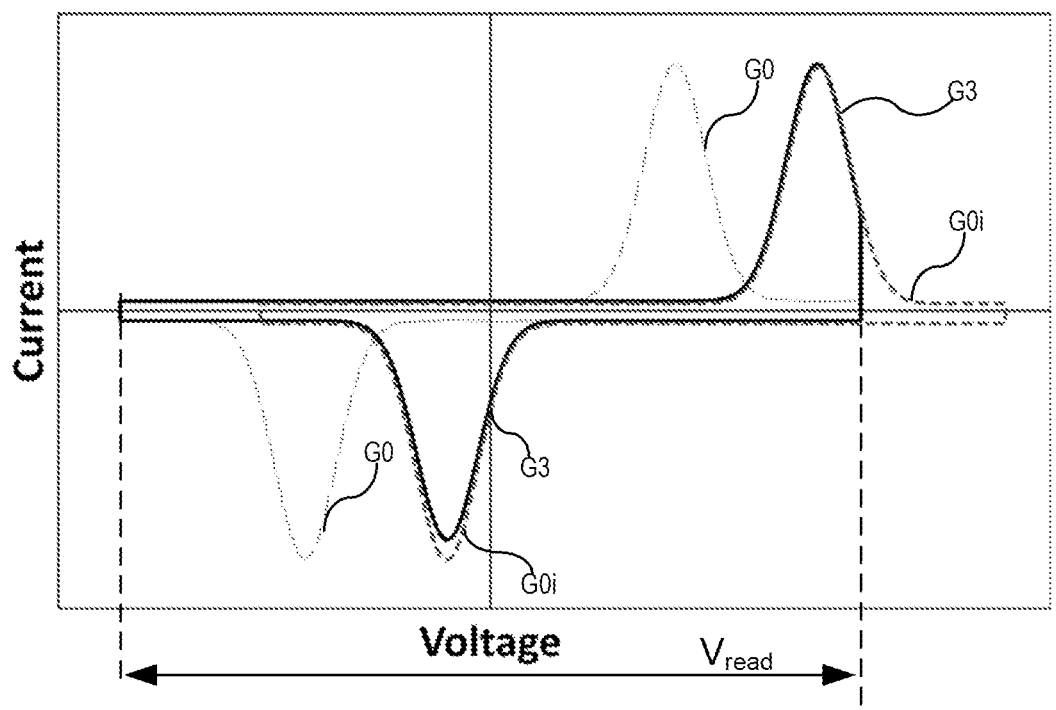
Figure 10F:
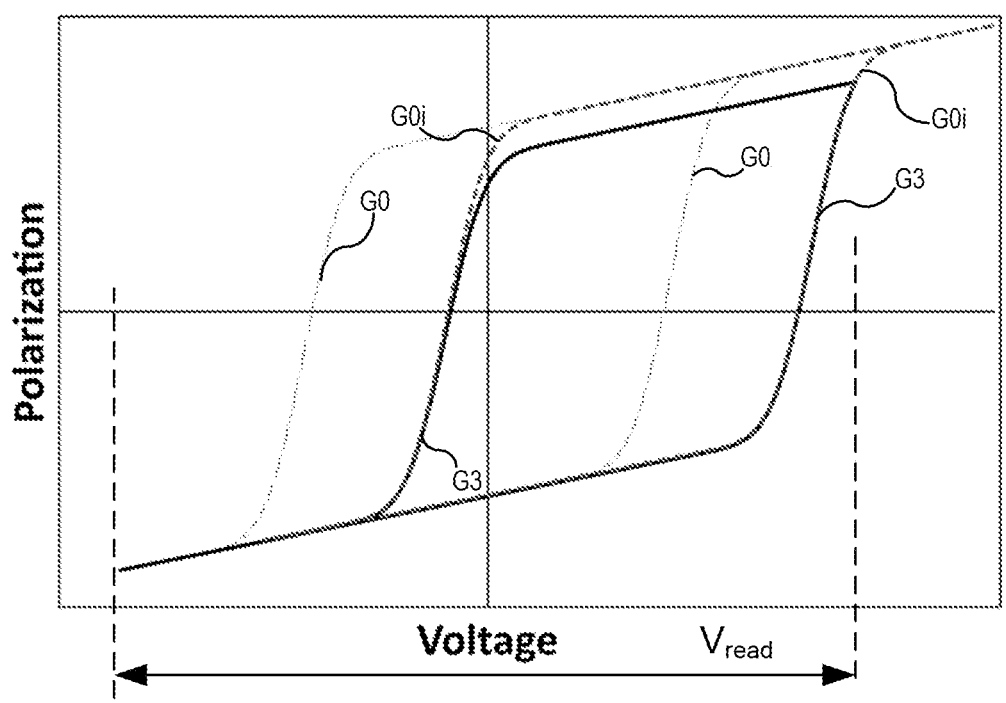
Figure 10G:
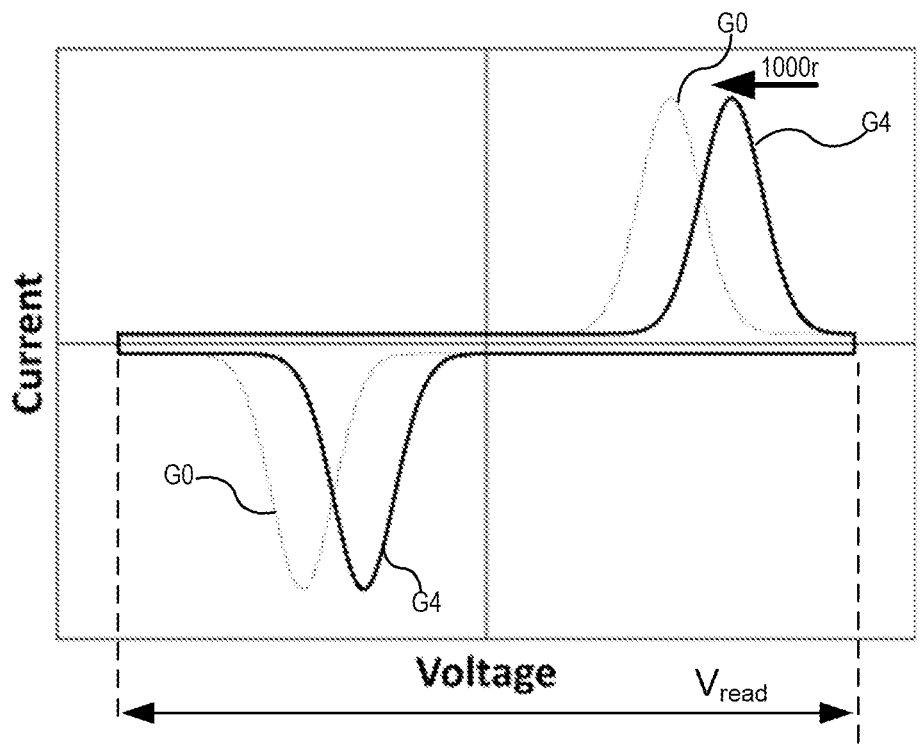
Figure 10H:
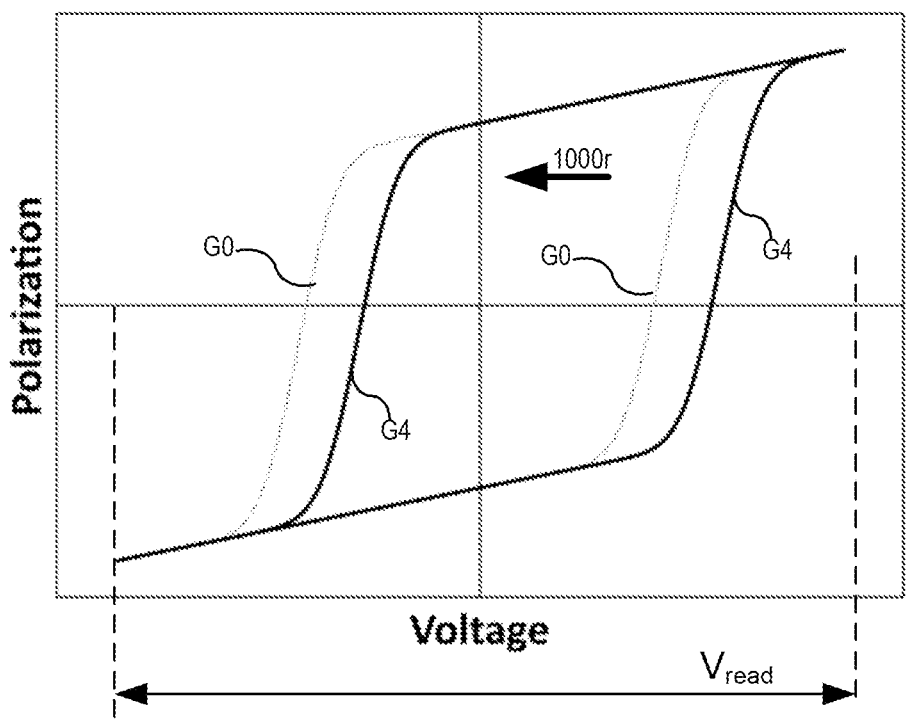
Figure 11A:
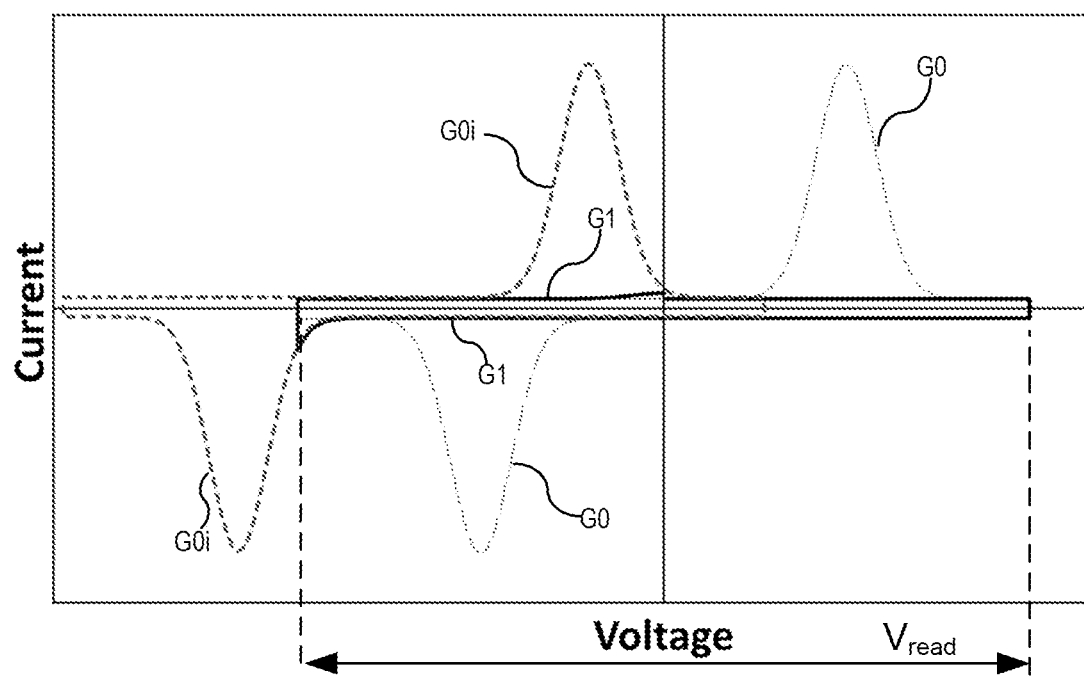
FIG. 11A to FIG. 11H show various aspects of current/voltage and polarization/voltage properties of a memory element with a remanent polarizable portion during a destructive read out operation based on a bipolar voltage drop sequence.
Figure 11B:
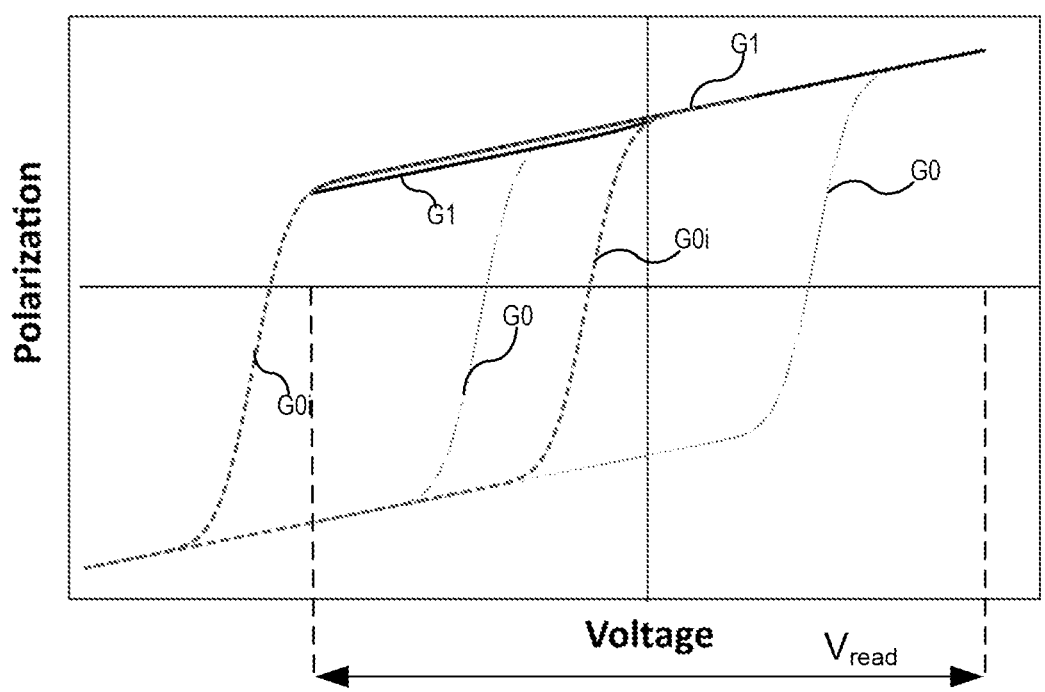
Figure 11C:
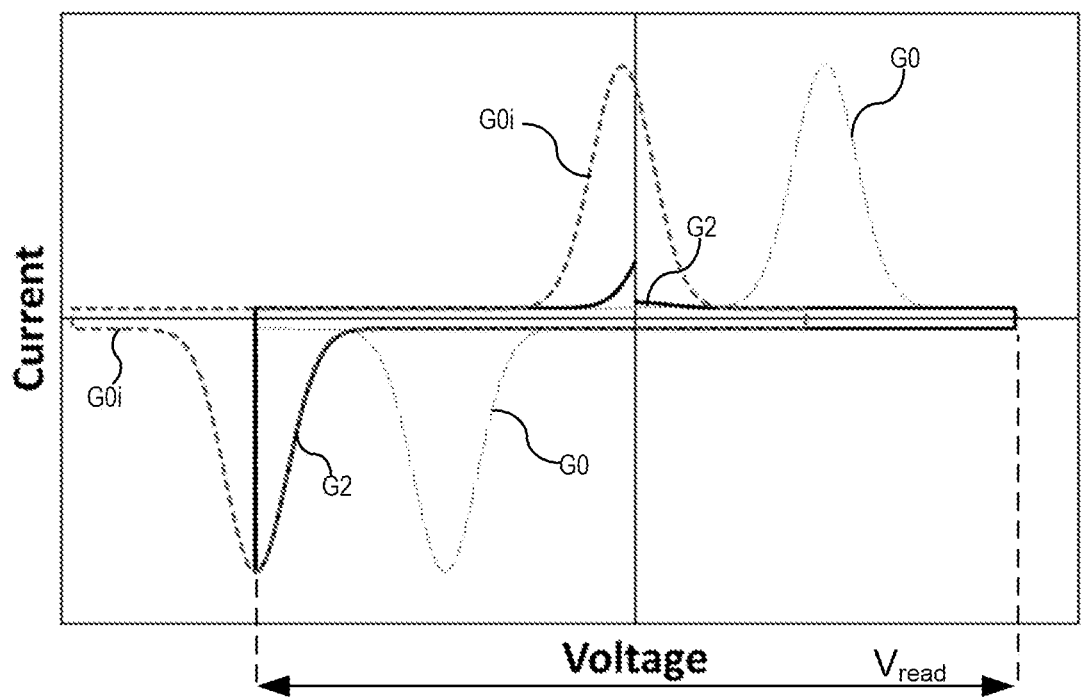
Figure 11D:
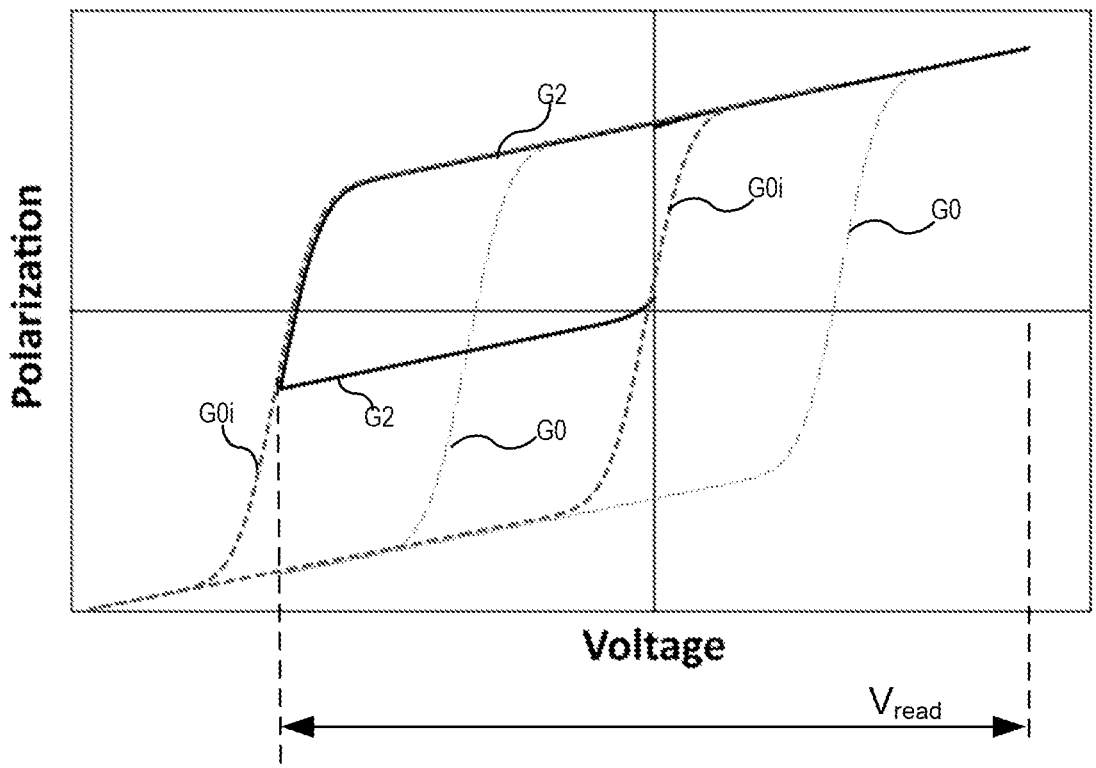
Figure 11E:
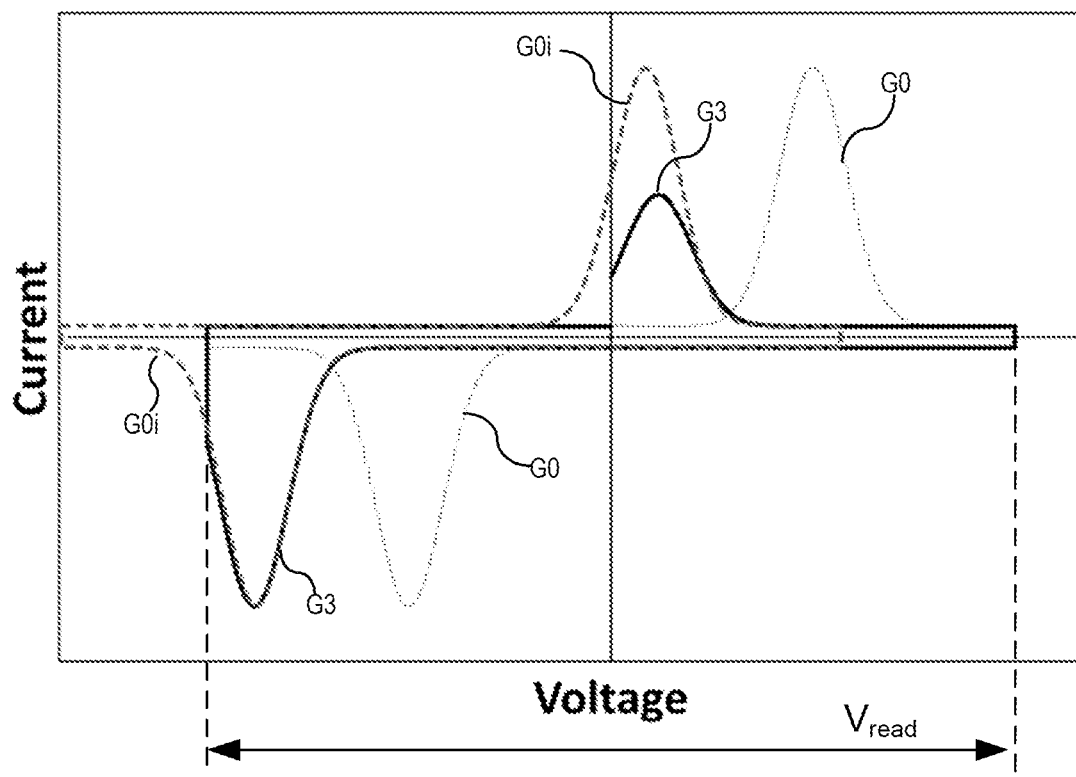
Figure 11F:
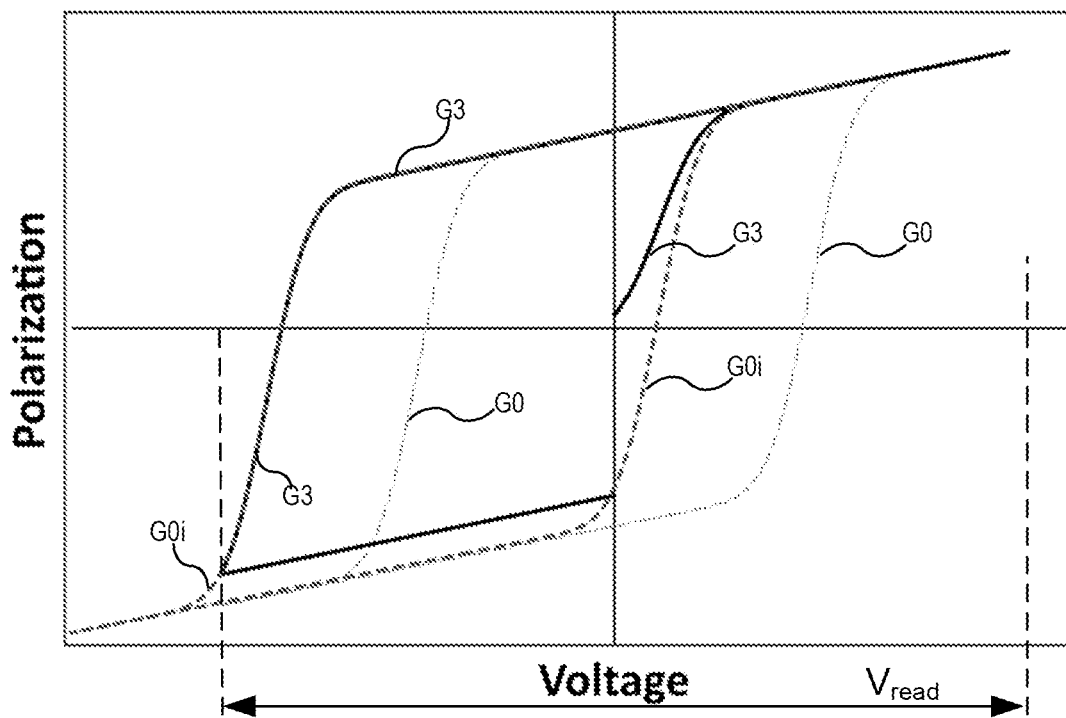
Figure 11G:
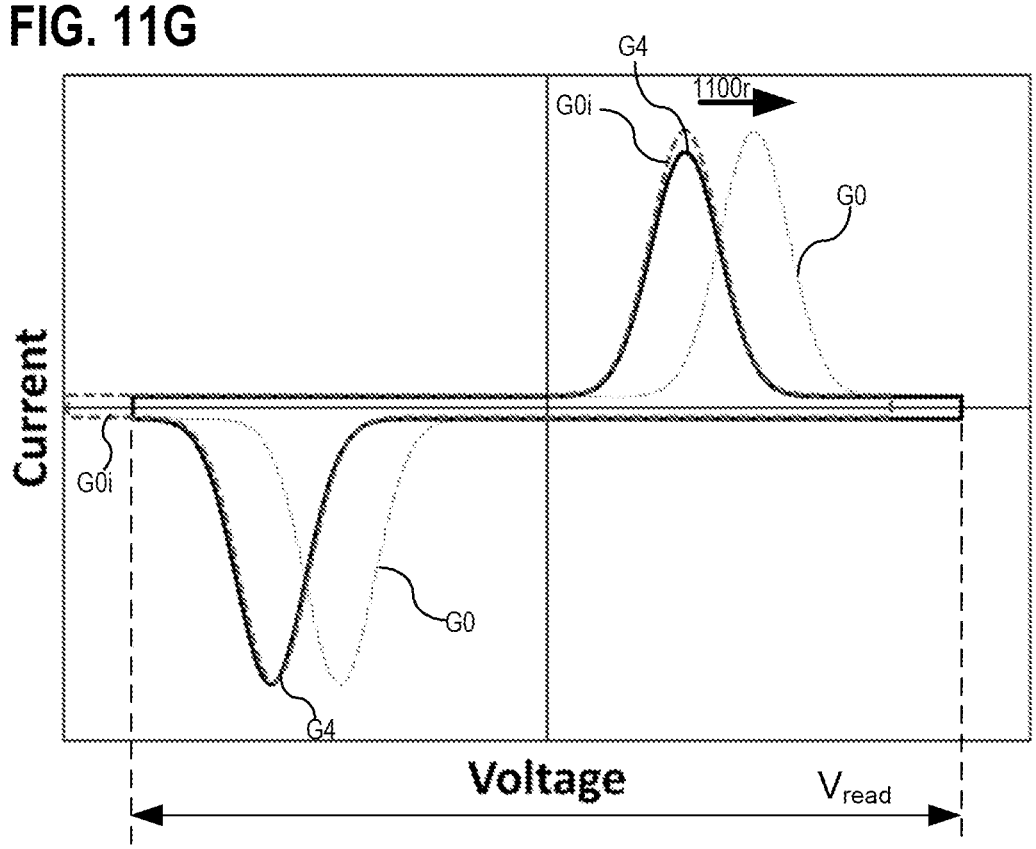
Figure 11H:
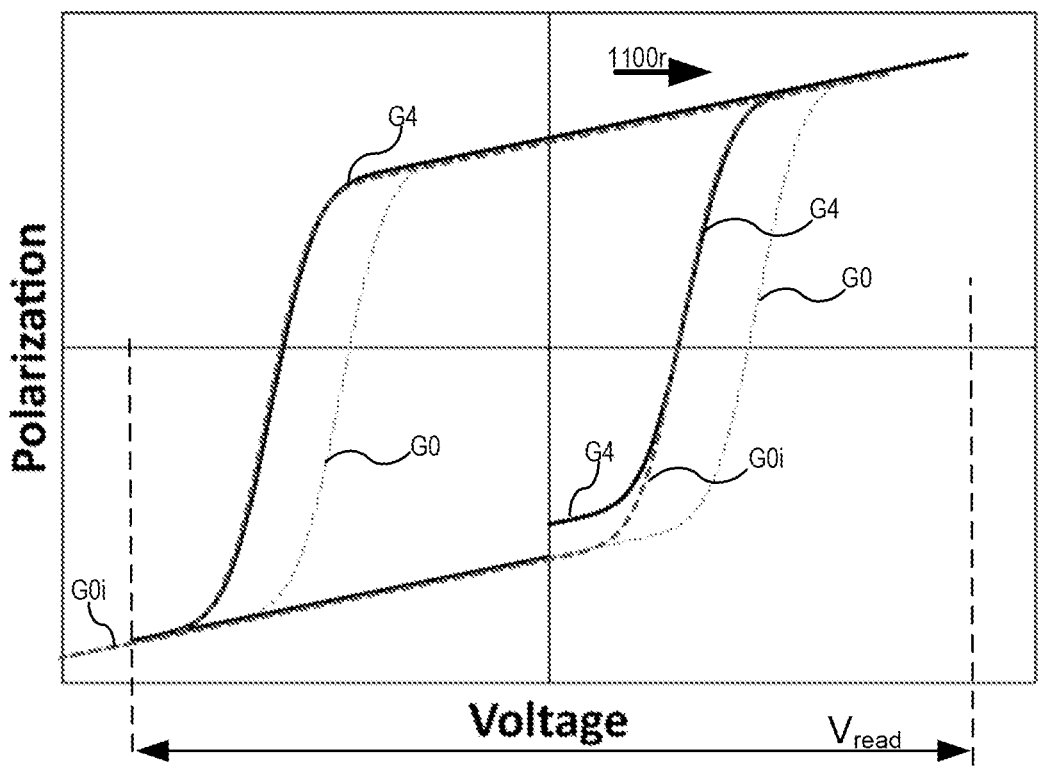

Since the memory cell shows a substantial imprint effect, the memory cell may not switch as desired within the read voltage window as explained with reference to FIG. 8A and FIG. 8B. As shown in FIGS. 10A and 10B as well as in FIGS. 11A and 11B, the memory cell to be read out may show no substantial switching (and therefore no charge/current aggregation at the bit-line) during the first and second read voltage drops of the sequence of bipolar read voltage drops. This may be due to the imprint effect, which may lead to the condition that the memory window is shifted (to positive voltages as shown in FIGS. 10A and 10B or to negative voltages as shown in FIGS. 11A and 11B) and is partially out of the read voltage range $V_{read}$. The graph G0 (dotted line) in FIGS. 10A and 10B as well as in FIGS. 11A and 11B shows the theoretical curve of an ideally centered memory window and the graph G0i (dashed line) shows the full imprinted curve which is not accessible by voltages in the read voltage range $V_{read}$. Therefore, the imprinted memory cell is not switched or only partially switched via the first voltage drops of the voltage drop sequence, see graph G1.

However, as explained herein, the imprint effect may be reduced with each cycle of positive and negative voltage drops of the bipolar voltage drop sequence, as illustrated in FIGS. 10C to 10H and FIGS. 11C to 11H, see graphs G2, G3, and G4. Therefore, the memory cell can be correctly read out via the bipolar voltage drop sequence, as described herein. In addition to the reliable read out characteristics, the actual memory window of the memory cell is at least partially re-centered 1000r, 1100r by the voltage drops of the bipolar voltage drop sequence (see graphs G4 in FIGS. 10G and 10H as well as FIGS. 11G and 11H).

The expected charge generated by a switching of the memory state of the memory cell may leading to a bit-line voltage difference which is expected to be around two time $P_r$, wherein $P_r$ is the residual polarization associated with the memory state. No switching charge is generated for the $1^{st}$ positive voltage drop of the voltage drop sequence in the case that the memory cell (e.g., a FeCAP) was already in the positive polarization state and therefore, the initial memory state of the memory cell can be identified based on the switching charge (e.g., integrated to a corresponding bit-line voltage), after a substantially full switching of the memory cell, the gain and loose of charge is independent of the further switchings of the memory cell. As an example, in the case of low or no imprint, see FIGS. 8C, 8D, and 9A to 9D, a substantially full switching is already caused by the first voltage drop (for a memory cell having initially a negative polarization state) or second voltage drop (for a memory cell having initially a positive polarization state) of the voltage drop sequence. However, the stronger the imprint the more cycles of bipolar voltage drops may be needed to obtain a substantially full switching of the memory cell, see FIGS. 8A, 8B, and 10A to 11H. However, this behavior is what allows to sense a difference in charge (and/or current and/or voltage) even after integration of several bipolar read cycles.

Illustratively, the higher the imprint, the lower the initial charge difference caused by the different memory states of the memory cell because to achieve a possibly desired full charge difference to distinguish the initial memory states from one another, the P-E loop (and/or the memory window) needs to be substantially re-centered first so that substantially full switching peaks can be covered by both voltage polarities, as shown in FIGS. 8A, 8B, and 10A to 11H. According to various aspects, a pulsed charge integration during the read cycles may increase the margin since half of the negative read current peak will not contribute to the integration in a pulsed integration scheme.

Figure 12:
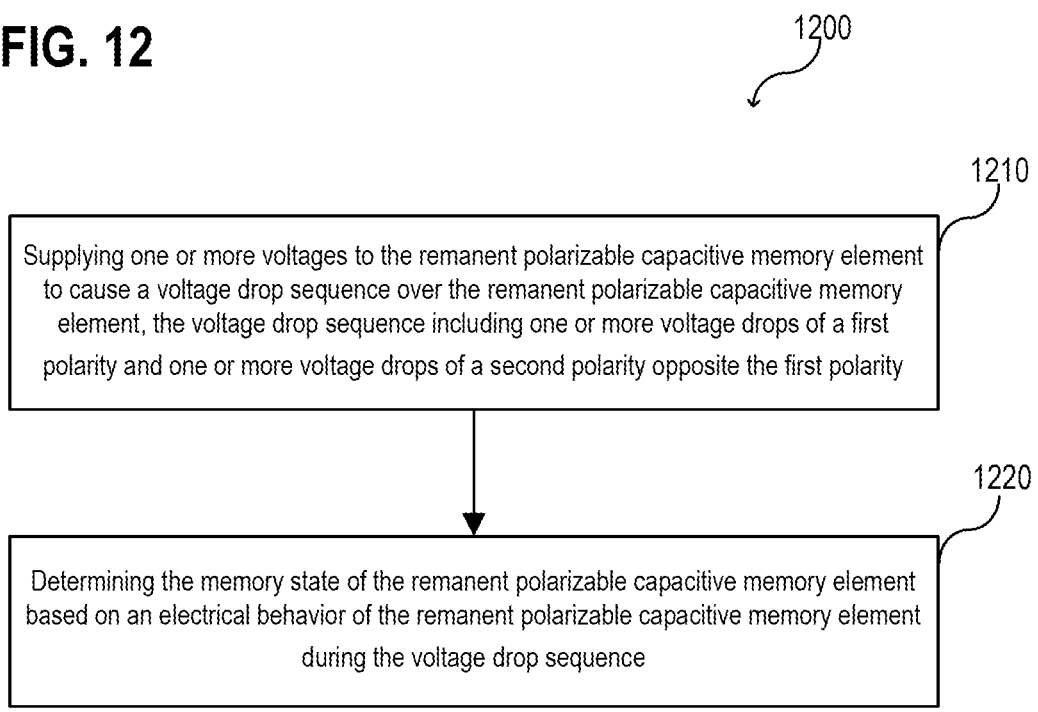
FIG. 12 shows a schematic flow diagram of a method for reading out a memory state of a remanent polarizable capacitive memory element, according to various aspects.

FIG. 12 shows a flow diagram of a method 1200 for reading out a memory state of a remanent polarizable capacitive memory element. Since the remanent polarizable capacitive memory element may be a memory cell or may be part of a memory cell, the method 1200 is understood as a method for reading out a memory state of a memory cell. The method 1200 may include, in 1210, supplying one or more voltages to the remanent polarizable capacitive memory element to cause a voltage drop sequence over the remanent polarizable capacitive memory element, the voltage drop sequence including one or more voltage drops of a first polarity and one or more voltage drops of a second polarity opposite the first polarity; and, e.g., subsequently in 1220, determining the memory state of the remanent polarizable capacitive memory element based on an electrical behavior of the remanent polarizable capacitive memory element during the voltage drop sequence.

Figure 13:
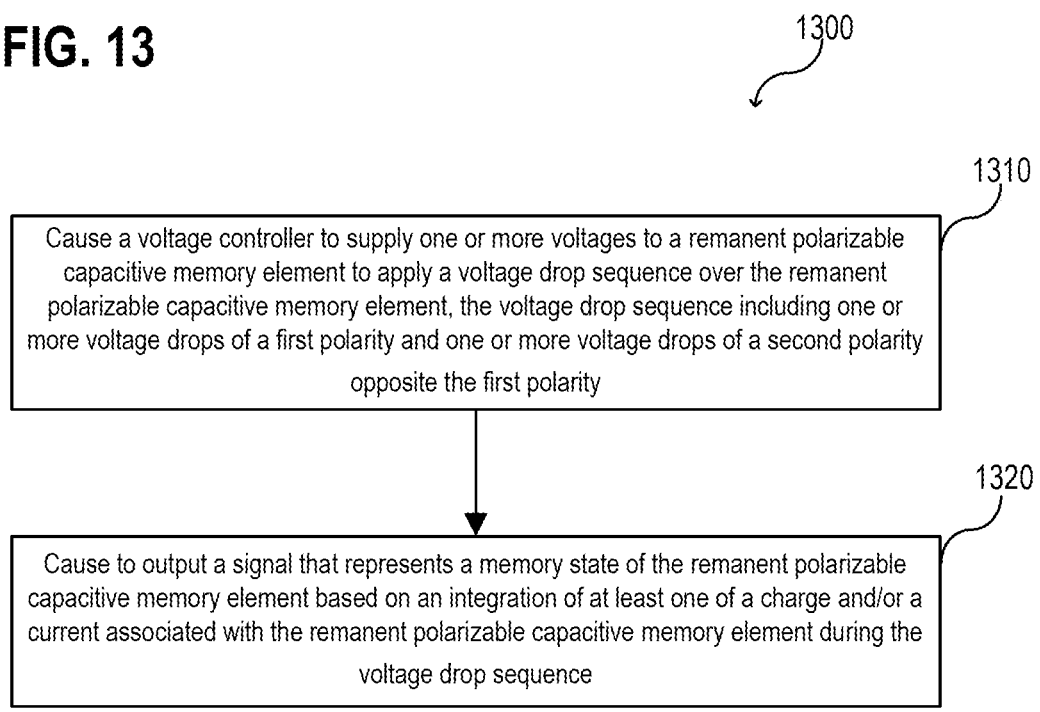
FIG. 13 shows a schematic flow diagram of a method for operating a memory controller, according to various aspects.

FIG. 13 shows a flow diagram of a method 1300 for operating a memory controller, according to various aspects. The method 1300 may include, in 1310, causing a voltage controller to supply one or more voltages to a remanent polarizable capacitive memory element to apply a voltage drop sequence over the remanent polarizable capacitive memory element, the voltage drop sequence including one or more voltage drops of a first polarity and one or more voltage drops of a second polarity opposite the first polarity; and, e.g., subsequently in 1320, cause to output a signal that represents a memory state of the remanent polarizable capacitive memory element based on an integration of at least one of a charge and/or a current associated with the remanent polarizable capacitive memory element during the voltage drop sequence.

In the following, various examples are provided that refer to a memory cell, a memory controller, a memory device, and/or a memory cell arrangement, and an operation thereof.

Example 1 is a memory device, including: a memory controller configured to cause a destructive read operation to read a capacitive memory cell, the destructive read operation including: at least one time supplying a first set of write voltages to the capacitive memory cell to switch the capacitive memory cell from a first memory state into a second memory state, and supplying a second set of write voltages to the capacitive memory cell to switch the capacitive memory cell from the second memory state into the first second memory state; and, subsequently, determining, based on a current/charge integration during the supplying of the first set of write voltages and the second set of write voltages, whether the memory cell was initially (before the first set of write voltages and the second set of write voltage are supplied to the capacitive memory cell) in the first memory state associated or in the second memory state.

In Example 2, the memory device according to example 1 may optionally further include that the first set of write voltages and the second set of write voltages cause voltage drops of opposite polarities over the capacitive memory element of the capacitive memory cell.

In Example 3, the memory device according to example 2 may optionally further include that the capacitive memory element of the capacitive memory cell includes (e.g., is) a remanent polarizable portion.

In Example 4, the memory device according to example 2 may optionally further include that the capacitive memory element of the capacitive memory cell includes (e.g., is) a memory element including at least one remanent polarizable portion.

In Example 5, the memory device according to example 3 or 4 may optionally further include that the remanent polarizable portion comprises at least one remanent polarizable material, e.g., at least one ferroelectric material.

In Example 6, the memory device according to any one of examples 1 to 5 may optionally further include that the capacitive memory cell (e.g., the memory element of the capacitive memory cell) is selectively switchable into a first set of remanent polarization states (e.g., with a first polarity of the remanent polarization) and into a second set of remanent polarization states (e.g., with a second polarity of the remanent polarization opposite to the first polarity).

In Example 7, the memory device according to example 6 may optionally further include that the capacitive memory cell is configured such that the first set of remanent polarization states and the second set of remanent polarization states define the first memory state and the second memory state of the capacitive memory cell respectively.

Example 8 is a memory device or a memory cell arrangement including a plurality of capacitive memory cells in accordance with examples 1 to 7, and a set of control lines such that a memory controller in accordance with examples 1 to 7 can operate the plurality of capacitive memory cells.

Example 11 is a memory device, including: a memory controller configured to cause a destructive read operation to determine an initial memory state of a memory element, the memory element comprising at least one remanent polarizable portion, the destructive read operation comprising: causing an alternating sequence of voltage drops of opposite polarities over the at least one remanent polarizable portion of the memory element; and, subsequently, determining the initial memory state of the memory element based on an electrical behavior of the memory element caused by the alternating sequence of voltage drops.

In Example 12, the memory device according to example 11 may optionally further include that the alternating sequence of voltage drops comprises a plurality of voltage drops of a first polarity to switch the memory element from a first memory state into a second memory state, and that the alternating sequence of voltage drops comprises a plurality of voltage drops of a second polarity to switch the memory element from the second memory state into the first memory state.

In Example 13, the memory device according to example 11 or 12 may optionally further include that the alternating sequence of voltage drops is further configured to shift an imprinted memory window of the memory element into the direction associated with a non-imprinted memory window during the destructive read operation.

In Example 14, the memory device according to any one of examples 11 to 13 may optionally further include that a read voltage range is associated with the memory element defined by a first switching voltage and a second switching voltage corresponding to a first memory state and a second memory state of the memory element respectively, and that an imprinted first memory state of the memory element is associated with a modified first switching voltage that is outside the read voltage range and wherein an imprinted second memory state of the memory element is associated with a modified second switching voltage that is outside the read voltage range; and that the alternating sequence of voltage drops is further configured to shift the modified first switching voltage and/or the modified second switching voltage back into the read voltage range.

In Example 15, the memory device according to any one of examples 11 to 14 may optionally further include that the alternating sequence of voltage drops comprises a plurality of voltage drops of a first polarity and a plurality of voltage drops of a second polarity inside the read voltage range, that the plurality of voltage drops of the first polarity are configured to switch the memory element from a first memory state into a second memory state in the case that the memory element is in the first memory state and a switching voltage of the memory element is inside the read voltage range or to change the switching voltage of the memory element in the case that the memory element is in the first memory state and the switching voltage is outside the read voltage range or to keep the memory element in a second memory state in the case that the memory element is in the second memory state; and that the plurality of voltage drops of the second polarity are configured to switch the memory element from the second memory state into the first memory state in the case that the memory element is in the second memory state and a switching voltage of the memory element is inside the read voltage range or to change the switching voltage of the memory element in the case that the memory element is in the second memory state and the switching voltage is outside the read voltage range or to keep the memory element in the first memory state in the case that the memory element is in the first memory state.

In Example 16, the memory device according to any one of examples 11 to 15 may optionally further include that the electrical behavior of the memory element is at least one of the following: a read current flow associated with a possible switching of the memory element during the first voltage drop is present at the memory element and with a possible switching of the memory element during the second voltage drop is present at the memory element; presence or absence of a switching charge associated with a possible switching of the memory element during the first voltage drop is present at the memory element and with a possible switching of the memory element during the second voltage drop is present at the memory element; a read voltage representing an integrated current flow associated with a possible switching of the memory element during the first voltage drop is present at the memory element and with a possible switching of the memory element during the second voltage drop is present at the memory element; and/or a read voltage representing an integrated change of a charge associated with a possible switching of the memory element during the first voltage drop is present at the memory element and with a possible switching of the memory element during the second voltage drop is present at the memory element.

In Example 17, the memory device according to any one of examples 11 to 16 may optionally further include: an access field-effect transistor, wherein a first source/drain region of the access field-effect transistor is electrically conductively connected to a first electrode of the memory element; a word line electrically conductively connected to a gate of the access field-effect transistor; a bit-line electrically conductively connected to a second source/drain region of the access field-effect transistor; and a plate-line electrically conductively connected to a second electrode of the memory element, wherein the at least one remanent polarizable portion of the memory element is disposed between the first electrode and the second electrode in a capacitive arrangement.

In Example 18, the memory device according to example 17 may optionally further include that the electrical behavior of the memory element is or is represented by a charging state or a voltage state of the bit-line, and that the first voltage drop and the second voltage drop over the memory element are caused by providing a first switch voltage and a second switch voltage to the plate-line respectively.

In Example 19, the memory device according to any one of examples 11 to 16 may optionally further include: a word line electrically conductively connected to a first electrode of the memory element; and a bit-line electrically conductively connected to a second electrode of the memory element, wherein the at least one remanent polarizable portion of the memory element is disposed between the first electrode and the second electrode in a capacitive arrangement.

In Example 20, the memory device according to example 19 may optionally further include that the electrical behavior of the memory element is or is represented by a charge state or a voltage of the bit-line, and that the first voltage drop and the second voltage drop over the memory element are caused by providing a first switch voltage and a second switch voltage to the word-line respectively.

In Example 21, the memory device according to any one of examples 11 to 20 may optionally further include that the at least one remanent polarizable portion of the memory element is configured to reside in a respective polarization state selected of a set of first polarization states associated with a first memory state of the memory element and a set of second polarization states associated with a second memory state of the memory element.

In Example 22, the memory device according to any one of examples 11 to 21 may optionally further include that the memory controller and the memory element are configured such that a voltage drop of a first polarity either switches the at least one remanent polarizable portion of the memory element from a polarization state of the set of first polarization states to a polarization state of the set of second polarization states or shifts the at least one remanent polarizable portion of the memory element from a polarization state of the set of first polarization states to another polarization state of the set of first polarization states; and that the memory controller and the memory element are configured such that a voltage drop of a second polarity either switches the at least one remanent polarizable portion of the memory element from a polarization state of the set of second polarization states to a polarization state of the set of first polarization states or shifts the at least one remanent polarizable portion of the memory element from a polarization state of the set of second polarization states to another polarization state of the set of second polarization states.

In Example 23, the memory device according to example 22 may optionally further include that the memory controller and the memory element are configured such that a first voltage drop of a first polarity and/or a first voltage drop of a second polarity shifts the at least one remanent polarizable portion of the memory element from a polarization state of the set of first polarization states to another polarization state of the set of first polarization states, and such that subsequently a second voltage drop of the first polarity shifts the at least one remanent polarizable portion of the memory element from a polarization state of the set of first polarization states to a polarization state of the set of second polarization states, and/or that the memory controller and the memory element are configured such that a first voltage drop of a first polarity and/or a first voltage drop of a second polarity shifts the at least one remanent polarizable portion of the memory element from a polarization state of the set of second polarization states to another polarization state of the set of second polarization states, and such that subsequently a second voltage drop of the second polarity shifts the at least one remanent polarizable portion of the memory element from a polarization state of the set of second polarization states to a polarization state of the set of first polarization states.

Example 24 is a memory controller, comprising: means to cause a destructive read operation to read a memory state of a memory element, the memory element comprising at least one remanent polarizable portion, the destructive read operation comprising: causing a voltage drop sequence over the at least one remanent polarizable portion of the memory element, the voltage drop sequence comprising one or more voltage drops of a first polarity and one or more voltage drops of a second polarity opposite the first polarity; and, subsequently, determining the memory state of the memory element based on an electrical behavior of the memory element during the voltage drop sequence.

In Example 25, the memory controller according to example 24 may optionally further include that determining the memory state of the memory element comprises an integration of one or more switching currents and/or one or more switching charges caused by one or more changes of a polarization state of the at least one remanent polarizable portion due to the voltage drop sequence.

In Example 26, the memory controller according to examples 24 or 25 may optionally further include that determining the memory state of the memory element comprises generating a readout voltage at a control line connected to the memory element, wherein the readout voltage is representative of the memory state of the memory element.

Example 27 is a method for reading out a memory state of a remanent polarizable capacitive memory element, the method comprising: supplying one or more voltages to the remanent polarizable capacitive memory element to cause a voltage drop sequence over the remanent polarizable capacitive memory element, the voltage drop sequence comprising one or more voltage drops of a first polarity and one or more voltage drops of a second polarity opposite the first polarity; and, subsequently, determining the memory state of the remanent polarizable capacitive memory element based on an electrical behavior of the remanent polarizable capacitive memory element during the voltage drop sequence.

In Example 28, the method according to example 27 may optionally further include that determining the memory state comprises determining a read out voltage value to which a bit-line connected to the remanent polarizable capacitive memory element is charged due to the voltage drop sequence.

In Example 29, the method according to example 27 or 28 may optionally further include that supplying one or more voltages to the remanent polarizable capacitive memory element comprises applying a read voltage with an alternating polarity to a control line connected to a first electrode of the remanent polarizable capacitive memory element to charge a bit-line connected to a second electrode of the remanent polarizable capacitive memory element to a read-out voltage value representative for the memory state in which the memory element was residing in before the voltage drop sequence is caused.

In Example 30, the method according to any one of examples 27 to 29 may optionally further include that determining the memory state comprises: continuously integrating a read out current flow in a bit-line connected to the remanent polarizable capacitive memory element during the voltage drop sequence; or dis-continuously integrating a read out current flow in a bit-line connected to the remanent polarizable capacitive memory element during a set of time intervals while the voltage drop sequence is caused.

Example 31 is a method for operating a memory controller, the method including: cause a voltage controller to supply one or more voltages to a remanent polarizable capacitive memory element to apply a voltage drop sequence over the remanent polarizable capacitive memory element, the voltage drop sequence including one or more voltage drops of a first polarity and one or more voltage drops of a second polarity opposite the first polarity; and, e.g., subsequently, cause to output a signal that represents a memory state of the remanent polarizable capacitive memory element based on an integration of at least one of a charge and/or a current associated with the remanent polarizable capacitive memory element during the voltage drop sequence.

The terms "at least one" and "one or more" may be understood to include any integer number greater than or equal to one, i.e. one, two, three, four, [ . . . ], etc. The term "a plurality" or "a multiplicity" may be understood to include any integer number greater than or equal to two, i.e. two, three, four, five, [ . . . ], etc. The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

The term "connected" may be used herein with respect to nodes, terminals, integrated circuit elements, and the like, to mean electrically connected, which may include a direct connection or an indirect connection, wherein an indirect connection may only include additional structures in the current path that do not influence the substantial functioning of the described circuit or device. The term "electrically conductively connected" that is used herein to describe an electrical connection between one or more terminals, nodes, regions, contacts, etc., may be understood as an electrically conductive connection with, for example, ohmic behavior, e.g. provided by a metal or degenerate semiconductor in absence of p-n junctions in the current path. The term "electrically conductively connected" may be also referred to as "galvanically connected".

The term "spontaneously polarizable material" or "spontaneous-polarizable material" may be used herein with reference to a material or layer that has a polarization capability in addition to its dielectric polarization capability. A spontaneously-polarizable material may be or may include a spontaneously-polarizable material that shows a remanence, e.g., a ferroelectric material, and/or a spontaneously-polarizable material that shows no remanence, e.g., an anti-ferroelectric material.

According to various aspects, a capacitive memory structure may include a ferroelectric capacitor (FeCAP) or an anti-ferroelectric capacitor (AFeCAP); or, in other aspects, a capacitive memory structure may include a ferroelectric capacitor or an anti-ferroelectric capacitor (AFeCAP), and one or more additional elements. According to various aspects, a capacitive memory structure may include a capacitive memory element, e.g., a ferroelectric layer, e.g., an anti-ferroelectric layer.

While the invention has been particularly shown and described with reference to specific aspects, it should be understood by those skilled in the art that various changes in form and detail may be made therein without departing from the spirit and scope of the invention as defined by the appended claims. The scope of the invention is thus indicated by the appended claims and all changes, which come within the meaning and range of equivalency of the claims, are therefore intended to be embraced.

What is claimed is:

1. A memory device, comprising:
    a memory controller configured to cause a destructive read operation to determine an initial memory state of a memory element, the memory element comprising at least one remanent polarizable portion, the destructive read operation comprising:
        causing an alternating sequence of voltage drops of opposite polarities over the at least one remanent polarizable portion of the memory element; and, subsequently,
        determining the initial memory state of the memory element based on an electrical behavior of the memory element caused by the alternating sequence of voltage drops.

2. The memory device according to claim 1,
    wherein the alternating sequence of voltage drops comprises a plurality of voltage drops of a first polarity to switch the memory element from a first memory state into a second memory state, and
    wherein the alternating sequence of voltage drops comprises a plurality of voltage drops of a second polarity to switch the memory element from the second memory state into the first memory state.

3. The memory device according to claim 1,
    wherein the alternating sequence of voltage drops is further configured to shift an imprinted memory window of the memory element into a direction associated with a non-imprinted memory window during the destructive read operation.

4. The memory device according to claim 1,
    wherein a read voltage range is associated with the memory element defined by a first switching voltage and a second switching voltage corresponding to a first memory state and a second memory state of the memory element respectively, and
    wherein an imprinted first memory state of the memory element is associated with a modified first switching voltage that is outside the read voltage range and wherein an imprinted second memory state of the memory element is associated with a modified second switching voltage that is outside the read voltage range; and
    wherein the alternating sequence of voltage drops is further configured to shift the modified first switching voltage and/or the modified second switching voltage back into the read voltage range.

5. The memory device according to claim 1,
    wherein the alternating sequence of voltage drops comprises a plurality of voltage drops of a first polarity and a plurality of voltage drops of a second polarity inside a read voltage range,
    wherein the plurality of voltage drops of the first polarity are configured to switch the memory element from a first memory state into a second memory state in the case that the memory element is in the first memory state and a switching voltage of the memory element is inside the read voltage range or to change the switching voltage of the memory element in the case that the memory element is in the first memory state and the switching voltage is outside the read voltage range or to keep the memory element in a second memory state in the case that the memory element is in the second memory state; and
    wherein the plurality of voltage drops of the second polarity are configured to switch the memory element from the second memory state into the first memory state in the case that the memory element is in the second memory state and a switching voltage of the memory element is inside the read voltage range or to change the switching voltage of the memory element in the case that the memory element is in the second memory state and the switching voltage is outside the read voltage range or to keep the memory element in the first memory state in the case that the memory element is in the first memory state.

6. The memory device according to claim 1,
    wherein the electrical behavior of the memory element is at least one of the following:
    a read current flow associated with a possible switching of the memory element during a first voltage drop is present at the memory element and with a possible switching of the memory element during a second voltage drop is present at the memory element;
    presence or absence of a switching charge associated with a possible switching of the memory element during the first voltage drop is present at the memory element and with a possible switching of the memory element during the second voltage drop is present at the memory element;
    a read voltage representing an integrated current flow associated with a possible switching of the memory element during the first voltage drop is present at the memory element and with a possible switching of the memory element during the second voltage drop is present at the memory element; and/or
    a read voltage representing an integrated change of a charge associated with a possible switching of the memory element during the first voltage drop is present at the memory element and with a possible switching of the memory element during the second voltage drop is present at the memory element.

7. The memory device according to claim 1, further comprising:
    an access field-effect transistor, wherein a first source/drain region of the access field-effect transistor is electrically conductively connected to a first electrode of the memory element;
    a word line electrically conductively connected to a gate of the access field-effect transistor;
    a bit-line electrically conductively connected to a second source/drain region of the access field-effect transistor; and a plate-line electrically conductively connected to a second electrode of the memory element, wherein the at least one remanent polarizable portion of the memory element is disposed between the first electrode and the second electrode in a capacitive arrangement.

8. The memory device according to claim 7,
wherein the electrical behavior of the memory element is or is represented by a charging state or a voltage state of the bit-line, and
wherein a first voltage drop and a second voltage drop over the memory element are caused by providing a first switch voltage and a second switch voltage to the plate-line respectively.

9. The memory device according to claim 1, further comprising:
a word line electrically conductively connected to a first electrode of the memory element; and
a bit-line electrically conductively connected to a second electrode of the memory element, wherein the at least one remanent polarizable portion of the memory element is disposed between the first electrode and the second electrode in a capacitive arrangement.

10. The memory device according to claim 9,
wherein the electrical behavior of the memory element is or is represented by a charge state or a voltage of the bit-line, and
wherein a first voltage drop and a second voltage drop over the memory element are caused by providing a first switch voltage and a second switch voltage to the word-line respectively.

11. The memory device according to claim 1,
wherein the at least one remanent polarizable portion of the memory element is configured to reside in a respective polarization state selected of a set of first polarization states associated with a first memory state of the memory element and a set of second polarization states associated with a second memory state of the memory element.

12. The memory device according to claim 11,
wherein the memory controller and the memory element are configured such that a voltage drop of a first polarity either switches the at least one remanent polarizable portion of the memory element from a polarization state of the set of first polarization states to a polarization state of the set of second polarization states or shifts the at least one remanent polarizable portion of the memory element from a polarization state of the set of first polarization states to another polarization state of the set of first polarization states; and
wherein the memory controller and the memory element are configured such that a voltage drop of a second polarity either switches the at least one remanent polarizable portion of the memory element from a polarization state of the set of second polarization states to a polarization state of the set of first polarization states or shifts the at least one remanent polarizable portion of the memory element from a polarization state of the set of second polarization states to another polarization state of the set of second polarization states.

13. The memory device according to claim 12,
wherein the memory controller and the memory element are configured such that a first voltage drop of a first polarity and/or a first voltage drop of a second polarity shifts the at least one remanent polarizable portion of the memory element from a polarization state of the set of first polarization states to another polarization state of the set of first polarization states, and such that subsequently a second voltage drop of the first polarity shifts the at least one remanent polarizable portion of the memory element from a polarization state of the set of first polarization states to a polarization state of the set of second polarization states, and/or
wherein the memory controller and the memory element are configured such that a first voltage drop of a first polarity and/or a first voltage drop of a second polarity shifts the at least one remanent polarizable portion of the memory element from a polarization state of the set of second polarization states to another polarization state of the set of second polarization states, and such that subsequently a second voltage drop of the second polarity shifts the at least one remanent polarizable portion of the memory element from a polarization state of the set of second polarization states to a polarization state of the set of first polarization states.

14. A memory controller, comprising:
means to cause a destructive read operation to read a memory state of a memory element, the memory element comprising at least one remanent polarizable portion, the destructive read operation comprising:
causing a voltage drop sequence over the at least one remanent polarizable portion of the memory element, the voltage drop sequence comprising one or more voltage drops of a first polarity and one or more voltage drops of a second polarity opposite the first polarity; and, subsequently,
determining the memory state of the memory element based on an electrical behavior of the memory element during the voltage drop sequence.

15. The memory controller of claim 14,
wherein determining the memory state of the memory element comprises an integration of one or more switching currents and/or one or more switching charges caused by one or more changes of a polarization state of the at least one remanent polarizable portion due to the voltage drop sequence.

16. The memory controller of claim 14,
wherein determining the memory state of the memory element comprises generating a readout voltage at a control line connected to the memory element, wherein the readout voltage is representative of the memory state of the memory element.

17. A method for reading out a memory state of a remanent polarizable capacitive memory element, the method comprising:
supplying one or more voltages to the remanent polarizable capacitive memory element to cause a voltage drop sequence over the remanent polarizable capacitive memory element, the voltage drop sequence comprising one or more voltage drops of a first polarity and one or more voltage drops of a second polarity opposite the first polarity; and, subsequently,
determining the memory state of the remanent polarizable capacitive memory element based on an electrical behavior of the remanent polarizable capacitive memory element during the voltage drop sequence.

18. The method of claim 17,
wherein determining the memory state comprises determining a read out voltage value to which a bit-line connected to the remanent polarizable capacitive memory element is charged due to the voltage drop sequence.

19. The method of claim 17,
wherein supplying one or more voltages to the remanent polarizable capacitive memory element comprises applying a read voltage with an alternating polarity to a control line connected to a first electrode of the remanent polarizable capacitive memory element to charge a bit-line connected to a second electrode of the remanent polarizable capacitive memory element to a read-out voltage value representative for the memory state in which the memory element was residing in before the voltage drop sequence is caused.

20. The method of claim 17, wherein determining the memory state comprises:

continuously integrating a read out current flow in a bit-line connected to the remanent polarizable capacitive memory element during the voltage drop sequence;

or dis-continuously integrating a read out current flow in a bit-line connected to the remanent polarizable capacitive memory element during a set of time intervals while the voltage drop sequence is caused.

* * * * *